(12) United States Patent
Nakasugi et al.

(10) Patent No.: US 8,697,336 B2
(45) Date of Patent: Apr. 15, 2014

(54) COMPOSITION FOR FORMING A DEVELOPABLE BOTTOM ANTIREFLECTIVE COATING

(75) Inventors: Shigemasa Nakasugi, Kakegawa (JP); Kazuma Yamamoto, Kakegawa (JP); Yasushi Akiyama, Kakegawa (JP); Shinji Miyazaki, Kakegawa (JP); Munirathna Padmanaban, Bridgewater, NJ (US); Srinivasan Chakrapani, Bridgewater, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 33 days.

(21) Appl. No.: 13/327,030

(22) Filed: Dec. 15, 2011

(65) Prior Publication Data
US 2013/0157196 A1 Jun. 20, 2013

(51) Int. Cl.
G03F 7/027 (2006.01)
G03F 7/11 (2006.01)
G03F 7/30 (2006.01)
G03F 7/40 (2006.01)
H01L 21/027 (2006.01)

(52) U.S. Cl.
USPC ............ 430/283.1; 430/270.1; 430/271.1; 430/326; 430/325; 524/111; 524/354; 438/952; 438/950; 522/117

(58) Field of Classification Search
None
See application file for complete search history.

(56) References Cited

U.S. PATENT DOCUMENTS

| | | | |
|---|---|---|---|
| 6,156,479 A | 12/2000 | Meador et al. | |
| 6,927,266 B2 | 8/2005 | Arase et al. | |
| 7,824,837 B2 | 11/2010 | Wu et al. | |
| 7,947,424 B2 | 5/2011 | Kishioka et al. | |
| 8,039,202 B2 | 10/2011 | Sui et al. | |
| 8,088,548 B2 | 1/2012 | Houlihan et al. | |
| 8,142,988 B2 | 3/2012 | Zampini et al. | |
| 8,455,176 B2 | 6/2013 | Houlihan et al. | |
| 2005/0214674 A1 | 9/2005 | Sui et al. | |
| 2009/0149618 A1* | 6/2009 | Jen et al. | 526/326 |
| 2010/0297556 A1* | 11/2010 | Cameron et al. | 430/271.1 |
| 2010/0297557 A1 | 11/2010 | Cameron et al. | |
| 2011/0003250 A1* | 1/2011 | Amara et al. | 430/271.1 |
| 2011/0076626 A1 | 3/2011 | Padmanaban et al. | |
| 2011/0086312 A1 | 4/2011 | Dammel et al. | |
| 2013/0236833 A1 | 9/2013 | Houlihan et al. | |

FOREIGN PATENT DOCUMENTS

| | | |
|---|---|---|
| EP | 2 261 738 A2 * | 12/2010 |
| JP | 2002-323771 A | 11/2002 |
| JP | 2004-102203 A | 4/2004 |
| JP | 2005-250434 A | 9/2005 |
| JP | 2006-341590 A | 12/2006 |
| JP | 2010-256859 A | 11/2010 |
| WO | WO 2012/074994 A1 * | 6/2012 |

OTHER PUBLICATIONS

International Search Report (Form PCT/ISA/210) date of mailing Jan. 22, 2013 for PCT/2012/083167, which corresponds to U.S. Appl. No. 13/327,030.

* cited by examiner

*Primary Examiner* — Cynthia Hamilton
(74) *Attorney, Agent, or Firm* — Sangya Jain

(57) ABSTRACT

The present invention provides a composition for forming a bottom anti-reflective coating, and also provides a photoresist pattern formation method employing that composition. The composition gives a bottom anti-reflective coating used in a lithographic process for manufacturing semiconductor devices, and the coating can be developed with a developing solution for photoresist. The composition contains a solvent, a polymer having a condensed polycyclic aromatic group, and a compound having a maleimide derivative or a maleic anhydride derivative. The composition may further contain a photo acid generator or a crosslinking agent.

14 Claims, No Drawings

COMPOSITION FOR FORMING A DEVELOPABLE BOTTOM ANTIREFLECTIVE COATING

TECHNICAL FIELD

The present invention relates to a composition for forming a bottom, anti-reflective coating employed in lithographic pattern formation using photoresist, and also to a bottom anti-reflective coating formation method employing that composition. In addition, the present invention further relates to a bottom anti-reflective coating formed from the composition.

BACKGROUND ART

In production of semiconductor devices, micro-fabrication is generally carried out according to lithographic techniques by use of photoresist. The process of micro-fabrication comprises the steps of: forming a thin photoresist layer on a semiconductor substrate such as a silicon wafer; covering the layer with a mask pattern corresponding to the aimed device pattern; exposing the layer to active light such as UV light through the mask pattern; developing the exposed layer to obtain a photoresist pattern; and etching the substrate by use of the photoresist pattern as a protective film, to form a fine relief corresponding to the above pattern. Since integration degree of semiconductor devices has been increased recently, the step of exposure tends to be carried out by use of light of very short wavelength, such as KrF excimer laser light (wavelength: 248 nm), ArF excimer laser light (wavelength: 193 nm) or extreme UV light (wavelength: 13.5 nm). The above photolithographic process, however, often suffers from a problem of dimension precision degradation of the photoresist pattern. The dimension precision degradation is caused by a standing wave of light reflected from the substrate and/or by diffused reflection of the exposure light due to roughness of the substrate. Further, the resist layer may be adversely effected by gases given off from the substrate placed thereunder if the exposure is performed by use of light of very short wavelength, such as extreme UV light. To cope with those problems, many researchers are studying about a bottom anti-reflective coating provided between the photoresist layer and the substrate. The bottom anti-reflective coating is required to have various properties. For example, it is preferred for the bottom anti-reflective coating to largely absorb radiation used for exposure of the photoresist, to prevent diffuse reflection and the like so that the exposed and developed photoresist can have a cross section perpendicular to the substrate surface, and to be insoluble in solvents contained in the photoresist composition (namely, not to cause intermixing). The intermixing is particularly serious because it often gives adverse effects to the interface between the photoresist layer and the bottom anti-reflective coating. Accordingly, the intermixing is liable to make it difficult to control the pattern or shape of the photoresist.

The bottom anti-reflective coating is often formed from a thermo-crosslinkable composition, so as to prevent intermixing with the photoresist applied thereon. Consequently, the formed coating is generally insoluble in an alkaline developing solution used for development of the photoresist. Accordingly, in general, the anti-reflective coating must be removed by dry-etching before fabrication of the semiconductor substrate (see, for example, Patent document 1).

However, when the coating is removed by dry-etching, the photoresist tends to be partly removed together with the coating. This makes it difficult to keep enough thickness of the photoresist to fabricate the substrate.

In view of this, it is desired to develop a bottom anti-reflective coating which is sufficiently soluble in an alkaline developing solution used for development of the photoresist and hence which can be developed and removed together with the photoresist. In order to meet this desire, researchers have studied the bottom anti-reflective coating developable and removable together with the photoresist, wherein the pattern is formed in the photoresist and the bottom anti-reflective coating.

For example, methods are proposed in which reactions between dienes and dienophiles are made to form bottom anti-reflective coatings developable and removable together with the photoresist (Patent documents 2 to 4). However, if those methods are adopted, it is often the case that the coating is still not crosslinked when the photoresist composition is spread thereon and, as a result, the coating is liable to intermix with the photoresist layer. In order to avoid the intermixing, the solvent of the photoresist composition must be selected not to dissolve the bottom anti-reflection coating. Accordingly, since usable photoresists are restricted depending on the selected solvent, there is a problem of lacking versatility.

PRIOR ART DOCUMENTS

[Patent document 1] U.S. Pat. No. 6,156,479

[Patent document 2] Japanese Patent Laid-Open No. 2011-53652

[Patent document 3] Japanese Patent Laid-Open No. 2010-256859

[Patent document 4] Japanese Patent Laid-Open No. 2010-250280

[Patent document 5] Japanese Patent Laid-Open No. 2004-102203

DETAILED DESCRIPTION

Problem to be Solved by the Invention

In consideration of the above problems, it is an object of the present invention to provide a bottom anti-reflective coating which does not intermix with the resist layer and which is optionally soluble in an alkaline developing solution used for development of the photoresist, and also provides good lithographic performance. Further, it is also an object of the present invention to provide a composition for forming that bottom anti-reflective coating.

SUMMARY OF INVENTION

The present invention relates to a composition for forming a bottom anti-reflective coating, comprising a solvent, a polymer comprising the following formula (1):

$$-A_m-B_n- \qquad (1)$$

in which

A and B are repeating units represented by the following formulas (A) and (B), respectively:

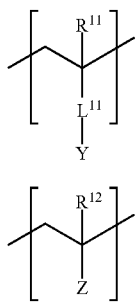

(A)

(B)

wherein
each of $R^{11}$ and $R^{12}$ is independently hydrogen or an alkyl group;
$L^{11}$ is a single bond, COO or a straight- or branched chain alkylene containing one or more carbon atoms;
Y is a condensed polycyclic aromatic group containing two or more benzene rings, and,
Z is a group selected from the group consisting of $R^3COOR^4$ and $R^3OR^4$, provided that $R^3$ is a single bond, oxygen or a straight- or branched chain alkylene which may optionally have a fluorine atom and which contains one or more carbon atoms and also provided that $R^4$ is hydrogen or a substituted or non-substituted hydrocarbon group;
A and B may be combined either randomly or in blocks;
each of A and B may be a combination of two or more repeating units having different structures; and
each of m and n is a number indicating the polymerization degree provided that m is not less than 10 and n is not less than 0;
and
a compound comprising a maleimide or a maleic anhydride. Further the compound may be represented by any of the following formulas (2) to (4):

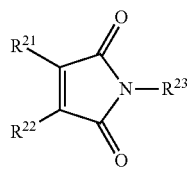

in which each of $R^{21}$, $R^{22}$ and $R^{23}$ is independently a group selected from the group consisting of hydrogen, alkyl, aryl, halogen atom, alkoxy, nitro, aldehyde, cyano, amido, dialkylamino, sulfonamido, imido, carboxylic acid, carboxylic acid ester, sulfonic acid, sulfonic acid ester, alkylamino, and arylamino;

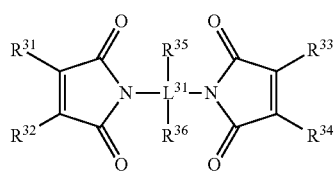

in which each of $R^{31}$ to $R^{36}$ is independently a group selected from the group consisting of hydrogen, alkyl, aryl, halogen, alkoxy, nitro, aldehyde, cyano, amido, dialkylamino, sulfonamido, imido, carboxylic acid, carboxylic acid ester, sulfonic acid, sulfonic acid ester, alkylamino, and arylamino; and $L^{31}$ is an alkylene or an arylene;
and

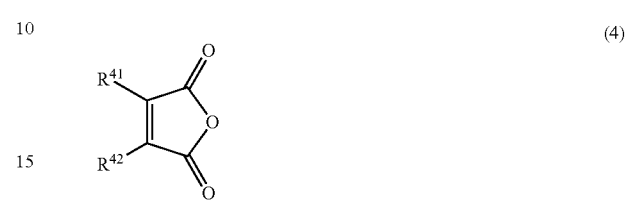

in which each of $R^{41}$ and $R^{42}$ is independently a group selected from the group consisting of hydrogen, alkyl, aryl, halogen atom, alkoxy, nitro, aldehyde, cyano, amido, dialkylamino, sulfonamido, imido, carboxylic acid, carboxylic acid ester, sulfonic acid, sulfonic acid ester, alkylamino, and arylamino.

The present invention further relates to a bottom anti-reflective coating formed by spreading on a substrate and then heating the above composition for forming a bottom anti-reflective coating.

The present invention also relates to a pattern formation method comprising the steps of:
spreading the above composition for forming a bottom anti-reflective coating on a semiconductor substrate and then baking it, to form a bottom anti-reflective coating;
forming a photoresist layer on the bottom anti-reflective coating;
exposing to radiation the semiconductor substrate covered with the bottom anti-reflective coating and the photoresist layer; and after the exposure,
developing by use of a developing solution selected from the group consisting of alkaline developing solutions and organic solvents.

Effect of the Invention

The composition according to the present invention enables to prevent intermixing with a photoresist composition layer and thereby to form a photoresist pattern having a cross section near perpendicular to the substrate surface. In one embodiment, by use of the composition of the present invention for forming a bottom anti-reflective coating, it becomes possible to form a bottom anti-reflective coating which can be readily dissolved after hardened in an alkaline developing solution used for development of the photoresist and accordingly which can be developed and removed together with the photoresist to form a pattern. In another embodiment, by use of the composition of the present invention for forming a bottom anti-reflective coating, it becomes possible to form a bottom anti-reflective coating which is not soluble in developer of the photoresist.

BEST MODE FOR CARRYING OUT THE INVENTION

Embodiments of the present invention are described below in detail.
The composition of the present invention for forming a bottom anti-reflective coating contains a polymer having an aromatic ring; a maleimide derivative or a maleic anhydride derivative; and a solvent, and further, if needed, a crosslinking agent or a photo acid generator. Those components of the composition are explained below in order.

(Polymer Having an Aromatic Ring)

The composition of the present invention for forming a bottom anti-reflective coating is hardened by a particular reaction. However, if the polymer used in the composition is properly selected, the coating formed from the composition can be made either removable by development or durable against a developing solution. The polymer for each type of the coating is described below.

The polymer used in the composition according to the present invention is represented by the formula (1):

In the formula (1), A and B are repeating units represented by the following formulas (A) and (B), respectively:

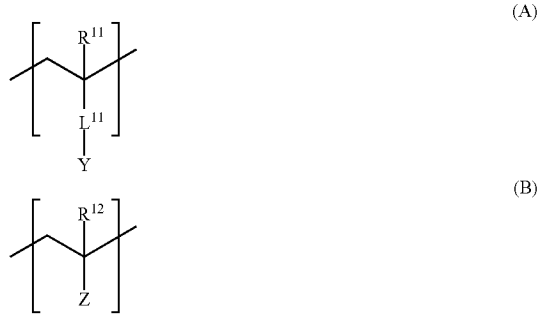

In the formulas (a) and (b),
each of $R^{11}$ and $R^{12}$ is independently hydrogen or an alkyl group, preferably hydrogen or methyl;
$L^{11}$ is a single bond, COO or a straight- or branched chain alkylene containing one or more carbon atoms, preferably COO;
Y is a condensed polycyclic aromatic group containing two or more benzene rings. The aromatic ring may be where one of the benzene rings may be replaced with a quinone ring and that the condensed polycyclic aromatic group may optionally have a substituent selected from the group consisting of alkyl, aryl, halogen, alkoxy, nitro, aldehyde, cyano, amido, dialkylamino, sulfonamido, imido, carboxy, carboxylic acid ester, sulfo, sulfonic acid ester, alkylamino, and arylamino; and
Z is a group selected from the group consisting of $R^3COOR^4$ and $R^3OR^4$, provided that $R^3$ is a single bond, oxygen or a straight- or branched chain alkylene which may optionally have a fluorine and which contains one or more, preferably 1 to 6 carbon atoms and also provided that $R^4$ is hydrogen or a substituted or non-substituted hydrocarbon group. The hydrocarbon group can be aromatic (such as phenyl, benzyl) or nonaromatic.
The repeating units A and B may be combined either randomly or in blocks;
each of A and B may be a combination of two or more repeating units having different structures; and
each of m and n is a number indicating the polymerization degree provided that m is not less than 10 and n is not less than 0.

The above polymer can be obtained by polymerizing monomers corresponding to the repeating units (A) and (B) in the formula (1).

The polymer represented by the formula (1) has a substituent Y, which is a condensed polycyclic aromatic group containing two or more benzene rings. This substituent enhances absorbance of light in particular wavelength, and thereby gives optical effects when contained in the bottom anti-reflective coating. Further, the substituent participates in a Diels-Alder reaction described later, and thereby enables to form the coating soluble in an alkaline developing solution. There is no particular restriction on the number of benzene rings contained in the polycyclic aromatic group, but the polycyclic aromatic group preferably contains five or less benzene rings. The polycyclic aromatic group may contain a five- or seven-membered hydrocarbon ring, but in one embodiment it does not contain that ring.

Examples of the condensed polycyclic aromatic rings containing the substituent Y include rings of naphthalene, anthracene, phenanthrene, tetracene, chrysene, benzo[c] phenanthrene, triphenylene, pentacene, picene, and benzo[c] chrysene. The polycyclic aromatic ring may have a substituent selected from the group consisting of alkyl, aryl, halogen atom, alkoxy, nitro, aldehyde, cyano, amido, dialkylamino, sulfonamido, imido, carboxy, carboxylic acid ester, sulfo, sulfonic acid ester, alkylamino, and arylamino. Further, one of the benzene rings contained in the condensed polycyclic aromatic ring may be replaced with a quinone ring. Examples of the quinone ring include rings of anthraquinone, 5,12-naphthacenequinone (tetracenequinone), 5,6-chrysenequinone, 6,12-chrysenequinone, and 6,13-pentacenequinone.

Since greatly contributing to light-absorption of the polymer, the substituent Y is preferably selected according to wavelength of light used for exposure. For example, if KrF laser (wavelength: 248 nm) is used as the exposure light source, the substituent Y preferably contains an anthracene ring or the like, which has high absorbance at that wavelength.

Examples of the monomer corresponding to the repeating unit (A) include naphthalene methacrylate 9-anthracenemethyl acrylate, 9-tetracenemethyl acrylate, 9-pentacenemethyl acrylate, 9-anthracenemethyl methacrylate, 9-tetracenemethyl methacrylate, and 9-pentacenemethyl methacrylate. In view of availability, 9-anthracenemethyl methacrylate is preferred. It is possible to use a combination of two or more monomers corresponding to the repeating unit (A). There is no particular restriction on how to obtain the monomer, and hence commercially available monomers may be used or otherwise monomers to use may be synthesized.

Meanwhile, the structure and polymerization ratio of the repeating unit (B) can be selected according to whether the coating formed from the composition of the present invention is made developable or insoluble in a developing solution. In the following description, for the sake of convenience, the composition for forming a bottom anti-reflective coating developable or insoluble in a developing solution is referred to as a "first" or "second" composition, respectively.

Further, with respect to the first composition for forming a bottom anti-reflective coating, the structure of its repeating unit (B) is selected also according to whether the coating formed from the composition is made photosensitive or not.

If $R^4$ at the terminal of the group Z is hydrogen, that is, if the group Z is $R^3COOH$ or $R^3OH$, particularly if the group Z is $R^3COOH$, the polymer is readily soluble in an alkaline developing solution and hence the composition can form a non-photosensitive bottom anti-reflective coating whether or not the exposure is carried out. On the other hand, if the group Z is $R^3COOR^4$ or $R^3OR^4$, particularly if the group Z is $R^3COOR^4$ (in which $R^4$ is a substituted or non-substituted hydrocarbon group, for example, t-butyl), the group Z as a whole is neither an acid radical nor a polar group and hence the polymer is hard to dissolve in an alkaline developing solution and the like. However, when the coating is exposed to light, acid is generated to release the alkyl group and thereby to increase solubility in an alkaline developing solution. As a result, the bottom anti-reflective coating becomes photosensitive. In consideration of this, it is preferred to select the structure of the repeating unit (B) suitably for the use of the bottom anti-reflective coating. Specifically, if the composition for forming a bottom anti-reflective coating needs to be non-photosensitive, $R^4$ is preferred to be hydrogen. If the composition needs to be photosensitive, $R^4$ is preferred to be a substituted or non-substituted hydrocarbon group. This hydrocarbon group may be a straight chain, branched chain or cyclic alkyl group, and may contain an oxygen or nitrogen atom replacing a carbon atom. Examples of the hydrocarbon group include straight chain alkyl, branched chain alkyl, cycloalkyl, cyclic lactone, benzyl, tetrahydrofuranyl, methyladamantyl, ethyladamantyl, oxathianyl, ethylcyclopentyl, menthyl, tetrahydropyranyl, and mevalonolactone. Preferred is a branched chain alkyl group having 1 to 10 carbon atoms.

In the group Z, $R^3$ serves as a linking group and is a single bond, an oxygen or a straight- or branched chain alkylene having 1 or more carbon atoms. The straight- or branched chain alkylene may have a fluorine atom, and preferably contains 1 to 6 carbon atoms. Examples of the linking group $R^3$ include a single bond, —O—, —CH$_2$—, —CH$_2$—CH$_2$—, —C(CF$_3$)$_2$— and —C(CF$_3$)$_2$O—. Among them, particularly preferred are a single bond and a straight-chain alkylene having 1 to 6 carbon atoms.

In view of controlling solubility of the bottom anti-reflective coating in an alkaline developing solution, the group Z is preferably $R^3COOR^4$ or $R^3OR^4$, more preferably $R^3COOR^4$.

Examples of the monomer corresponding to the repeating unit (B) include acrylic acid, 3-butenoic acid, 4-pentenoic acid, 5-hexenoic acid, 6-heptenoic acid, 7-octenoic acid, 8-nonenoic acid, methacrylic acid, 2-methyl-3-butenoic acid, 2-methyl-4-pentenoic acid, 2-methyl-5-hexenoic acid, 2-methyl-6-heptenoic acid, 2-methyl-7-octenoic acid, 2-methyl-8-nonenoic acid, 4-vinylbenzoic acid, tert-butyl acrylate, tert-butyl methacrylate, 9-hydroxynaphthyl methacrylate, 9-hydroxynaphthyl acrylate, 4-hydroxyphenyl methacrylate, 4-hydroxyphenyl acrylate, and 4-hydroxyl styrene. In view of availability, preferred are acrylic acid, methacrylic acid, tert-butyl acrylate, and tert-butyl methacrylate. There is no particular restriction on how to obtain the monomer, and hence commercially available monomers may be used or otherwise monomers to use may be synthesized. It is possible to use a combination of two or more monomers corresponding to the repeating unit (B). For example, acrylic acid or methacrylic acid can be used in combination of tert-butyl acrylate or tert-butyl methacrylate.

The bottom anti-reflective coating formed from the first composition is required to change its solubility in a developing solution between before and after the radiation exposure. In order to change the solubility, the repeating unit (B) is indispensable. Accordingly, the polymerization degree n needs to be not less than 1. Specifically, the polymerization ratio of the repeating unit (A) is preferably 30 to 60 mol %, more preferably 40 to 50 mol % based on all the repeating units constituting the polymer. That is because the polymer preferably contains the repeating unit (A) more than a particular amount so that the resultant bottom anti-reflective coating can have sufficient light-absorption and also because the polymer preferably contains the repeating unit (B) more than a particular amount so as to ensure solubility in a developing solution. The polymerization ratio of the repeating unit (B) is preferably 40 to 70 mol %. The polymer may contain other repeating units unless they impair the effect of the present invention; in one case, polymerization ratio is generally 10 mol % or less of the polymer.

In contrast, the bottom anti-reflective coating formed from the second composition is insoluble in the developing solution. Here, the term "insoluble" does not mean that the developing solution cannot dissolve the bottom anti-reflective coating at all, but it means that the coating becomes thinner by 1% or less in the step of development. In the second composition, it is unnecessary for the polymer to contain $R^3COOH$, $R^3OH$ or the precursors thereof (i.e., $R^3COOR^4$, $R^3OR^4$). The repeating unit (B) is, therefore, dispensable for the polymer used in the second composition for forming a bottom anti-reflective coating. Accordingly, as for the second composition, the polymerization degree n in the formula (1) is a number of 0 or more and hence the polymer may be a homopolymer consisting of only the repeating unit (A).

However, as long as the effect of the present invention can be obtained, the second composition for forming a bottom anti-reflective coating may contain the repeating unit (B) including $R^3COOH$ or $R^3OH$. In the second composition, the polymerization ratio of the repeating unit (B) including $R^3COOH$ or $R^3OH$ is preferably not more than 5 mol % or not more than 70 mol %, respectively. Examples of the monomer preferably used in this case include acrylic acid, 3-butenoic acid, 4-pentenoic acid, 5-hexenoic acid, 6-heptenoic acid, 7-octenoic acid, 8-nonenoic acid, methacrylic acid, 2-methyl-3-butenoic acid, 2-methyl-4-pentenoic acid, 2-methyl-5-hexenoic acid, 2-methyl-6-heptenoic acid, 2-methyl-7-octenoic acid, 2-methyl-8-nonenoic acid, 4-vinylbezoic acid, 9-hydroxynaphtyl methacrylate, 9-hydroxynaphthyl acrylate, 4-hydroxyphenyl methacrylate, 4-hydroxyphenyl acrylate, and 4-hydroxyl styrene.

On the other hand, the repeating unit (B) including $R^3COOR^4$ or $R^3OR^4$ (in which $R^4$ is a substituted or non-substituted hydrocarbon group) gives small effect on the solubility of the bottom anti-reflective coating, and hence it may be contained in the polymer in a relatively large amount. In that case, the polymerization ratio of the repeating unit (B) including $R^3COOR^4$ or $R^3OR^4$ is preferably not more than 75 mol %. Examples of the monomer preferably used in this case include tert-butyl acrylate, tert-butyl methacrylate, 9-hydroxynaphtyl methacrylate, 9-hydroxynaphthyl acrylate, 4-hydroxyphenyl methacrylate, 4-hydroxyphenyl acrylate, and 4-hydroxyl styrene.

In contrast, the polymerization ratio of the repeating unit (A) is preferably not less than 20 mol % based on the whole polymer, so as to ensure sufficient light-absorption.

The polymer represented by the formula (1) can be obtained from the above monomers in a proper solvent by use of a radical or ionic polymerization initiator. In the present invention, the polymer of the formula (1) may be any type of copolymers such as random copolymers or block copolymers, and accordingly the polymerization conditions can be selected according to the type of the polymer.

Examples of the polymerization initiator include 2,2'-azobis(isobutyronitrile) (AIBN), 2,2'-azobis-dimethyl-1-(2-methylpropionate), 2,2'-azobis-(4-methoxy-2,4-dimethylvaleronitrile), 2,2'-azobis-(2-cyclopropylpropionitrile), 2,2'-azobis(2,4-dimethylvaleronitrile), 2,2'-azobis(2,4-dimethylpentane-nitrile), 1,1'-azobis (cyclohexanecarbonitrile), benzoyl peroxide, t-butyl peroxide benzoate, di-t-butyldiperoxy phthalate, t-butylperoxy-2-ethylhexanoate, t-butylperoxy pivalate, t-amylperoxypivalate, and butyllithium. In view of safety and availability, 2,2'-azobis-dimethyl-1-(2-methylpropionate) is preferred.

The amount thereof is preferably 1 to 10 wt % based on the total weight of all the monomers.

Examples of the solvents preferably used for the polymerization reaction include toluene, tetrahydrofuran, benzene, methyl amyl ketone, dimethylformamide, dimethyl sulfoxide, ethyl lactate, and propyleneglycol monomethyl ether acetate (PGMEA). Those solvents may be used singly or in combination of two or more. The amount thereof is preferably 1 to 10 times as large as the total weight of all the monomers.

The polymerization reaction is conducted at a temperature of normally 50 to 200° C., preferably 60 to 150° C., more preferably 80 to 120° C.

In the present invention, there is no particular restriction on the molecular weight of the polymer represented by the formula (1). However, when measured in terms of standard polystyrene by gel permeation chromatography (GPC), the weight average molecular weight thereof is preferably in the range of 2000 to 5000000 Da. Further, in consideration of film formability, solubility and heat stability, it is more preferred for the polymer of the formula (1) to have, a weight average molecular weight of 3000 to 100000 Da. The molecular weight of the polymer, which is obtained by the polymerization reaction, can be controlled by various polymerization conditions such as polymerization time and temperature, concentrations of the monomers and the initiator used in the reaction, and the reaction solvent. If ionic polymerization is selected as the polymerization reaction, the polymer having a narrow molecular weight distribution can be obtained.

After the polymerization reaction is completed, the polymer can be separated and purified from the reaction solution by use of techniques adopted in normal polymer syntheses. For example, n-hexane or n-heptane, which is a poor solvent of the polymer but has good miscibility with the solvent of the polymerization is poured into the reaction solution so as to separate the polymer. However, without separating or purifying the polymer, the mixture solution obtained by the polymerization reaction may be directly used as a material of the composition for forming a bottom anti-reflective coating.

As long as all the components are homogeneously dissolved in the composition of the present invention for forming a bottom anti-reflective coating, there is no particular restriction on the concentration of the above polymer. However, in view of controlling the thickness, the concentration thereof is preferably 1 to 50 wt %, more preferably 1 to 2 wt % based on the total weight of the composition.

(Maleimide Derivative and Maleic Anhydride Derivative)

The composition of the present invention for forming a bottom anti-reflective coating contains a compound which is a maleimide derivative or a maleic anhydride derivative. The compound may be represented by any of the following formulas (2) to (4):

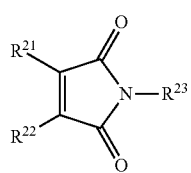

(2)

in which each of $R^{21}$, $R^{22}$ and $R^{23}$ is independently a group selected from the group consisting of hydrogen, alkyl, aryl, halogen atom, alkoxy, nitro, aldehyde, cyano, amido, dialkylamino, sulfonamido, imido, carboxylic acid, carboxylic acid ester, sulfonic acid, sulfonic acid ester, alkylamino, and arylamino;

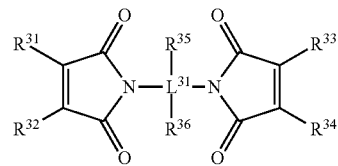

(3)

in which each of $R^{31}$ to $R^{36}$ is independently a group selected from the group consisting of hydrogen, alkyl, aryl, halogen, alkoxy, nitro, aldehyde, cyano, amido, dialkylamino, sulfonamido, imido, carboxylic acid, carboxylic acid ester, sulfonic acid, sulfonic acid ester, alkylamino, and arylamino; and $L^{31}$ is an alkylene or an arylene;

and

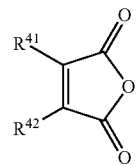

(4)

in which each of $R^{41}$ and $R^{42}$ is independently a group selected from the group consisting of hydrogen, alkyl, aryl, halogen, alkoxy, nitro, aldehyde, cyano, amido, dialkylamino, sulfonamido, imido, carboxylic acid, carboxylic acid ester, sulfonic acid, sulfonic acid ester, alkylamino, and arylamino. Among them, the compound of the formula (2) or (3) is a maleimide derivative while that of the formula (4) is a maleic anhydride derivative.

Examples of the compound represented by the formula (2) include maleimide, N-alkylmaleimide, N-aromatic maleimide, and N-sulfonic maleimide. Those compounds may be substituted with alkyl, aryl, halogen, alkoxy, nitro, aldehyde, cyano, amido, dialkylamino, sulfonamido, imido, carboxy, carboxylic acid ester, sulfo, sulfonic acid ester, alkylamino, or arylamino.

Examples of the compound represented by the formula (3) include N,N'-alkylbismaleimide, N,N'-aromatic bismaleimide, and N,N'-sulfonic bismaleimide. Those compounds may be substituted with alkyl, aryl, halogen atom, alkoxy, nitro, aldehyde, cyano, amido, dialkylamino, sulfonamido, imido, carboxy, carboxylic acid ester, sulfo, sulfonic acid ester, alkylamino, or arylamino. In formula (3), $L^{31}$ may be $C_1$-$C_{20}$ alkyl.

Examples of the compound represented by the formula (4) include maleic anhydride, which may be substituted with alkyl, aryl, halogen, alkoxy, nitro, aldehyde, cyano, amido, dialkylamino, sulfonamido, imido, carboxy, carboxylic acid ester, sulfo, sulfonic acid ester, alkylamino, or arylamino.

In one embodiment the compound represented by any of the formulas (2) to (4) causes a Diels-Alder reaction with the polymer of the formula (1). As a result of the reaction, the polymer forms a coating soluble in a developing solution of the photoresist. Thus, the effect of the first invention is obtained.

Examples of the compound represented by the formula (2) include 1,2-bismaleimide ethane, 1,4-bismaleimide butane, and 1,6-bismaleimide hexane.

Examples of the compound represented by the formula (3) include N,N'-1,4-phenylenedimaleimide, N,N'-1,3-phenylenedimaleimide, N,N'-4,4'-bismaleimide diphenylmethane, and bis(3-ethyl-5-methyl-4-maleimidephenyl) methane.

Examples of the compound represented by the formula (4) include maleic anhydride, methylmaleic anhydride, and dimethylmaleic anhydride.

There is no particular restriction on how to obtain those compounds, and hence commercially available compounds may be used or otherwise compounds to use may be synthesized. The compounds of the formulas (2) to (4) may be used in combination of two or more. The amount of the compound represented by any of the formulas (2) to (4) is preferably 0.1 to 1 mole, or 0.2 to 1 mole based on 1 mole of the aromatic group, such as naphthalene, anthracene, tetracene or pentacene, contained in the substituent Y in the above polymer. Accordingly, the compound causes a Diels-Alder reaction to combine with a part of the substituent Y in the above polymer. Since the substituent Y contributes to light-absorption of the bottom anti-reflective coating, the effect of the present invention cannot be obtained if all the substituents Y are reacted. Accordingly, the substituents Y are preferably left unreacted in an amount of 20% or more based on the number of the substituents Y contained before the reaction in the above polymer.

In the Diels-Alder reaction, the maleimide derivative or the like serves as a dienophile to react with a diene structure contained in the condensed polycyclic aromatic skeleton of the substituent Y, so that pi-bonds in the skeleton are rearranged and a new C—C bond and a new pi-bond are formed. By way of example, the reaction between an anthracene skeleton and a maleimide derivative is shown below.

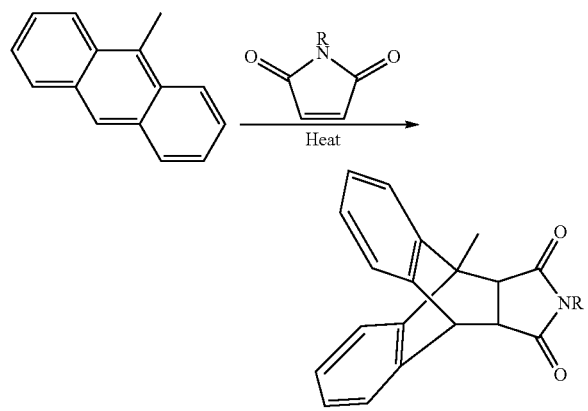

The above reaction enhances polarity of the polymer to lower solubility in a solvent, such as propylene glycol monomethylether acetate (PGMA), used for the photoresist. If a compound having two maleimide structures, such as a compound of the formula (3), is adopted, each maleimide reacts with the group Y in the polymer to form a crosslinking structure and hence to further lower the solubility in an organic solvent. This means that the compound of the formula (3) also functions as a crosslinking agent. Accordingly, it is preferred to use the compound represented by the formula (3).

In the first composition for forming a bottom anti-reflective coating, the polymer after the Diels-Alder reaction contains the group Z shown in the formula (1). The group Z includes carboxyl, hydroxyl or a group in which hydrogen of carboxyl or hydroxyl is substituted with an alkyl or the like. This substituted group is converted into carboxyl or hydroxyl by acid generated from the photo acid generator after exposed to light, and thereby the polymer becomes highly soluble in an alkaline developing solution containing a base such as strongly basic tetramethylammonium hydroxide (hereinafter, referred to as "TMAH").

As long as all the components are homogeneously dissolved in the composition of the present invention for forming a bottom anti-reflective coating, there is no particular restriction on the concentration of the compound represented by any of the formulas (2) to (4). However, as described above, the light-absorption and the solubility vary depending on the progression of the Diels-Alder reaction. Accordingly, the composition contains the compound of the formula (2), (3) or (4) in an amount of preferably 0.15 to 0.75 wt %, more preferably 0.2 to 0.4 wt %, based the total weight of the composition.

(Photo Acid Generator)

If necessary, the composition of the present invention for forming a bottom anti-reflective coating contains a photo acid generator. As the photo acid generator, any compound can be used as long as it generates acid when exposed to light of KrF excimer laser (wavelength: 248 nm), ArF excimer laser (wavelength: 193 nm) or the like.

The photo acid generator can be freely selected from conventionally known ones. Examples of the photo acid generator include onium salt compounds, sulfone maleimide derivatives, and disulfonyl diazomethane compounds.

Examples of the onium salt compounds include: iodonium salt compounds, such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoro-n-butanesulfonate, triphenylsulfonium camphorsulfonate, and triphenylsulfonium trifluoromethanesulfonate.

Examples of the sulfone maleimide derivatives include N-(trifluoromethanesulfonyloxy)succinimide, N-(fluoro-n-butanesulfonyloxy)succinimide, N-(camphor-sulfonyloxy)succinimide, and N-(trifluoromethanesulfonyl-oxy)naphthalimide.

Examples of the disulfonyl diazomethane compounds include bis(trifluoromethylsulfonyl)diazomethane, bis(cyclohexylsulfonyl)diazomethane, bis(phenylsulfonyl)diazomethane, bis(p-toluenesulfonyl)-diazomethane, bis(2,4-dimethylbenzenesulfonyl)diazomethane, and methylsulfonyl-p-toluenesulfonyldiazomethane.

The composition of the present invention for forming a bottom anti-reflective coating can contain those photo acid generators in combination of two or more. The amount of the photo acid generator is in the range of preferably 0.01 to 20 weight parts, more preferably 0.02 to 5 weight parts, based on 100 weight parts of the polymer represented by the formula (1). The photo acid generator can be also used for the purpose of controlling the shape of photoresist pattern. The mechanism of that is not completely known, but is presumed that the photo acid generator works to balance the acidity of the bottom anti-reflective coating. The photo acid generator thus enables to form a photoresist pattern in a preferred rectangular shape.

(Crosslinking Agent)

The composition of the present invention for forming a bottom anti-reflective coating contains a crosslinking agent, if necessary. As described above, if containing the compound of the formula (3), the composition forms a crosslinking structure when heated to lower the solubility in a solvent for photoresist. However, if containing the compound of the formula (2) or (4), the solubility of the polymer depends on how the substituents are changed by the Dields-Alder reaction. In that case, the crosslinking agent makes it possible to control the solubility by increasing the molecular weight. Even in the case where the composition contains the compound of the formula (3), the crosslinking agent is preferably incorporated therein if the amount of the compound is small.

As the crosslinking agent, any compound can be used as long as it is made to crosslink the polymer of the formula (1) by the generated acid when exposed to light of KrF excimer laser (wavelength: 248 nm), ArF excimer laser (wavelength: 193 nm) or the like.

Examples of the crosslinking agent include hexa-methylmelamine, hexa methoxymethylmelamine, 1,2-dihydroxy-N,N'-methoxymethylsuccinimide, 1,2-di-methoxy-N,N'-methoxymethylsuccinimide, tetramethoxymethylglycoluril, and N,N'-methoxymethylurea.

The amount of the crosslinking agent is preferably 10 to 50 weight parts, more preferably 15 to 30 weight parts, based on 100 weight parts of the polymer represented by the formula (1).

(Solvent)

Any solvent can be used in the (first or second) composition of the present invention for forming a bottom anti-reflective coating, as long as it can dissolve all the components. Examples of the solvent include ethyleneglycol monomethyl ether, ethyleneglycol monoethyl ether, methyl cellosolve acetate, ethyl cellosolve acetate, diethyleneglycol monomethyl ether, diethyleneglycol monoethyl ether, propylene glycol, propyleneglycol monomethyl ether, propyleneglycol monomethyl ether acetate, propyleneglycol propyl ether acetate, toluene, xylene, methyl ethyl ketone, cyclopentanone, cyclohexa none, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone. Those solvents can be used singly or in combination of two or more. Further, they may be used in combination with high boiling point solvents such as propyleneglycol monobutyl ether and propyleneglycol monobutyl ether acetate.

(Composition for Forming a Bottom Anti-Reflective Coating from the First Composition for Forming a Bottom Anti-Reflective Coating)

The composition of the present invention for forming a bottom anti-reflective coating can be prepared by mixing and dissolving the above components homogeneously.

In the preparation, the polymer of the formula (1) or the combination of other additives can be selected according to the use of the composition. If the bottom anti-reflective coating to produce is wanted to be both developable and photosensitive, the group Z of the polymer represented by the formula (1) is preferably $R^3COOR^4$ in which $R^4$ is a substituted or non-substituted hydrocarbon group. Further, in that case, the composition preferably contains a photo acid generator to assist elimination of $R^4$ caused by exposure. On the other hand, if the anti-reflective coating to produce is wanted to be non-photosensitive, the group Z is preferably $R^3COOH$.

If the bottom anti-reflective coating is designed to use with a positive-working photoresist layer, the composition basically consisting of the above combination can work satisfyingly. However, if the coating is designed to combine with a negative-working photoresist layer, the composition preferably further contains a crosslinking agent.

According to the present invention, even if the bottom anti-reflective coating is combined with a positive-working photoresist layer, it can be made possible to produce a negative-working resist pattern by changing the developing conditions (as described later in detail).

Further, if necessary, the composition of the present invention for forming a bottom anti-reflective coating can contain other additives, such as, thickening agents, surfactants, slipping agents, or colorants such as dyes.

The composition obtained by mixing the components is preferably used after filtration through a 0.2 to 0.05 μm porous size filter. The composition thus prepared is excellent in storage stability at room temperature for a long time.

(Formation Method of a Bottom Anti-Reflective Coating)

The below described is a bottom anti-reflective coating formation method employing the composition according to the present invention. In the following description, the pattern formation method is categorized into (a) to (e) and explained based on the kind of photoresist and the components contained in the composition for forming a bottom anti-reflective coating.

Pattern Formation Method (a)

First, in the case where the composition of the present invention is non-photosensitive and combined with a positive-working photoresist, the pattern formation method is described below.

The composition of the present invention for forming a bottom anti-reflective coating is spread by proper means, such as a spinner or a coater, on a semiconductor substrate (e.g., silicon/silicon dioxide-coated substrate, silicon nitride substrate, silicon wafer substrate, glass substrate, ITO substrate). In this method, the composition contains, at least, a polymer represented by the formula (1), a compound represented by any of the formulas (2) to (4), and a solvent. In the polymer of the formula (1), the group Z is preferably $R^3COOH$ or $R^3OH$, more preferably $R^3COOH$ so that the polymer can keep high solubility in an alkaline developing solution. The spread composition is then baked to form a bottom anti-reflective coating. The baking conditions are properly determined. For example, the baking temperature is generally 80 to 250° C., preferably 100 to 250° C.; and the baking time is generally 0.3 to 5 minutes, preferably 0.5 to 2 minutes. This baking drives a Diels-Alder reaction in the composition layer, and accordingly a hardening reaction proceeds to form a bottom anti-reflective coating.

On the bottom anti-reflective coating thus formed, a positive-working photoresist composition is applied. Here, the "positive-working photoresist" means a substance that causes a reaction under exposure to light and thereby increases solubility in an alkaline developing solution. There is no particular restriction on the photoresist, and any positive-working photoresist can be adopted as long as it is sensitive to light of exposure for pattern formation.

Thereafter, the step of exposure is carried out by use of a predetermined mask. There is no particular restriction on the wavelength of light used for exposure, but it is preferred to use light of 13.5 to 248 nm. Examples of the light include KrF excimer laser light (wavelength: 248 nm), ArF excimer laser light (wavelength: 193 nm) and extreme UV light (wavelength: 13.5 nm). If the exposure is performed by use of light of very short wavelength, such as extreme UV light, the light intensity is generally so weak that the bottom anti-reflective coating is not always very effective in preventing light-reflection, but the coating may function to inhibit adverse effects of gases given off from the substrate placed thereunder. After the exposure, post-exposure bake can be carried out. The temperature of post-exposure bake is 80 to 150° C., preferably 100 to 140° C.; and the time thereof is 0.3 to 5 minutes, preferably 0.5 to 2 minutes.

Successively, the step of development is carried out by use of an alkaline developing solution. Thereby, in the area exposed to light, the photoresist layer and the bottom anti-reflective coating placed thereunder are developed and removed to form a photoresist pattern, thereby forming a pattern in the photoresist and the antireflective coating.

Pattern Formation Method (b)

In the case where the composition of the present invention is non-photosensitive and combined with a negative-working photoresist, the pattern formation method (a) is repeated only except that the photoresist composition is changed. Here, the "negative-working photoresist" means a substance that causes a reaction under exposure to light and thereby decreases solubility in an alkaline developing solution. As a result of the exposure, the photoresist in the area exposed to light becomes to have low solubility and hence that in the area not exposed to light becomes to have relatively high solubility. Accordingly, when developed with the alkaline developing solution after the exposure, the photoresist is brought into contact with the alkaline developing solution and consequently the photoresist in the area not exposed to light is removed to leave that in the area exposed to light. Further, in the area where the photoresist is removed, the bared bottom anti-reflective coating is also dissolved and removed. Thus, in the area not exposed to light, the photoresist layer and the bottom anti-reflective coating placed thereunder are developed and removed to form a photoresist pattern.

Pattern Formation Method (c)

In the case where the composition of the present invention is photosensitive and combined with a positive-working photoresist, the polymer of the formula (1) preferably has a particular structure. That is, the group Z in the polymer is preferably $R^3COOR^4$ or $R^3OR^4$ (in which $R^4$ is a substituted or non-substituted hydrocarbon group) so that the solubility of the polymer can be changed by exposure. The polymer having that structure in itself has low solubility in an alkaline developing solution. However, when the composition is exposed to light, acid is generated and releases $R^4$ to enhance the solubility in an alkaline developing solution. The acid generated by exposure may be given either from a photo acid generator contained in the photoresist layer or from a photo acid generator added, as necessary, in the bottom anti-reflective coating.

The procedure of this method is the same as that of the pattern formation method (a). However, this pattern formation method is characterized in that the bottom anti-reflective coating before the exposure has low solubility in an alkaline solution but that the solubility is enhanced by exposure. Thus the pattern is formed in the photoresist and the antireflective coating.

Pattern Formation Method (d)

In the case where the composition of the present invention is photosensitive and combined with a negative-working photoresist, the polymer of the formula (1) preferably has a particular structure. That is, the group Z in the polymer is preferably $R^3COOH$ or $R^3OH$. The polymer having that structure in itself has high solubility in an alkaline developing solution. However, when the composition is exposed to light, the polymer of the formula (1) reacts with a crosslinking agent to lower the solubility in an alkaline developing solution. The acid generated by exposure may be given either from a photo acid generator contained in the photoresist layer or from a photo acid generator added, as necessary, in the bottom anti-reflective coating. The crosslinking agent is preferably contained in the bottom anti-reflective coating so that the coating in itself can be also crosslinked by the acid to lower the solubility in an alkaline developing solution.

Pattern Formation Method (e)

The above pattern formation methods (a) to (d) make use of the solubility of the bottom anti-reflective coating in an alkaline developing solution. However, it is also possible to utilize solubility thereof in an organic solvent for forming the pattern. Specifically, in the case where the composition of the present invention is photosensitive and combined with a positive-working photoresist as described above in the pattern formation method (c), the $R^4$ groups are released by exposure and accordingly polar groups such as COOH are thickly formed in the area exposed to light. Consequently, the coating in the exposed area becomes to have low solubility in an organic solvent, and hence that in the area not exposed to light becomes to have relatively high solubility. Accordingly, development can be carried out after exposure by use of an organic solvent, and thereby the photoresist and the bottom anti-reflective coating in the area not exposed to light can be removed to form a negative-type pattern. This pattern formation method is characterized in that a negative-type pattern can be obtained by use of a positive-working photoresist.

(Formation Method of a Bottom Anti-Reflective Coating from the Second Composition for Forming a Bottom Anti-Reflective Coating)

A bottom anti-reflective coating insoluble in a developing solution is formed from the second composition of the present invention for forming a bottom anti-reflective coating. The below described is a bottom anti-reflective coating formation method employing the second composition according to the present invention. In the following description, the pattern formation method is categorized into (f) to (h) and explained based on the kind of photoresist and the components contained in the composition for forming a bottom anti-reflective coating.

Pattern Formation Method (f)

The composition of the present invention for forming a bottom anti-reflective coating is spread by proper means, such as a spinner or a coater, on a semiconductor substrate (e.g., silicon/silicon dioxide-coated substrate, silicon nitride substrate, silicon wafer substrate, glass substrate, ITO substrate). In this method, the composition contains, at least, a polymer represented by the formula (1), a compound represented by any of the formulas (2) to (4), and a solvent, as described previously. The spread composition is then baked to form a bottom anti-reflective coating. The baking conditions are properly determined. For example, the baking temperature is generally 80 to 250° C., preferably 100 to 250° C.; and the baking time is generally 0.3 to 5 minutes, preferably 0.5 to 2 minutes. This baking drives a Diels-Alder reaction in the composition layer, and accordingly a hardening reaction proceeds to form a bottom anti-reflective coating.

On the bottom anti-reflective coating thus formed, a positive-working photoresist composition is applied in the same manner as in the above pattern formation method (a), and then exposed to light and developed to form a photoresist pattern, without forming a pattern in the antireflective coating.

Pattern Formation Method (g)

In the case where the composition for forming a bottom anti-reflective coating is combined with a negative-working photoresist, the pattern formation method (f) is repeated only except that the photoresist composition is changed. By use of this method, a negative-working photoresist pattern can be formed.

Pattern Formation Method (h)

The above pattern formation methods (f) and (g) make use of the insolubility of the bottom anti-reflective coating in an alkaline developing solution. However, in the same manner as in the pattern formation method (e), it is also possible to utilize insolubility thereof in an organic solvent for forming the pattern. Specifically, the composition for forming a bottom anti-reflective coating is combined with a positive-working photoresist, and then exposed to light. After the exposure, development is carried out by use of an organic solvent, so that a negative-type pattern can be obtained in the photoresist only.

Examples of the alkaline developing solution used in the pattern formation methods (a) to (d), (f) and (g) include: an aqueous solution of alkali metal hydroxide, such as potassium hydroxide or sodium hydroxide; an aqueous solution of tertiary ammonium hydroxide, such as tetramethylammonium hydroxide, tetraethylammonium hydroxide or choline; and an aqueous solution of amine, such as ethanolamine, propylamine or ethylenediamine. Particularly preferred is a 2.38 wt % TMAH aqueous solution, which is commonly used as an alkaline developing solution. Those developing solutions enable to dissolve and remove the bottom anti-reflective coating readily at room temperature. The developing solutions may contain surfactants and the like. Examples of the organic solvent used as a developing solution in the pattern formation methods (e) and (h) include (1) ketones, (2) esters, (3) alcohols, (4) amides, (5) ethers and (6) hydrocarbons. Examples of (1) ketones include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methyl cyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone and propylene carbonate. Example of (2) esters include methyl acetate, ethyl acetate, isopropyl acetate, n-butyl acetate, amyl acetate, propyleneglycol monomethylether acetate, ethyleneglycol monoethylether acetate, diethyleneglycol monobutylether acetate, diethyleneglycol monoethylether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Example of (3) alcohols include (3a) alcohols, such as methyl alcohol, ethyl alcohol, n-propyl alcohol, iso-propyl alcohol, n-butyl alcohol, sec-butyl alcohol, tert-butyl alcohol, iso-butyl alcohol, n-hexyl alcohol, n-heptyl alcohol, n-octyl alcohol, n-decanol and methoxy methyl butanol; (3b) glycols, such as ethylene glycol, diethylene glycol and triethylene glycol; and (3c) glycol ethers, such as ethyleneglycol monomethyl ether, propyleneglycol monomethyl ether, ethyleneglycol monoethyl ether, propyleneglycol monoethyl ether, diethyleneglycol monomethyl ether and triethyleneglycol monomethyl ether. Example of (4) amides include N-methyl-2-pyrrolidone, N,N-dimethylacetamide, N,N-dimethylformamide, hexamethylphosphoric triamide and 1,3-dimethyl-2-imidazolidinone. Examples of (5) ethers include glycol ethers of (3c), dioxane and tetrahydrofuran. Examples of (6) hydrocarbons include aromatic hydrocarbon solvents such as toluene and xylene, pentane, hexane, octane and decane.

The temperature of the developing solution is generally 5 to 50° C., preferably 25 to 40° C.; and the developing time is generally 10 to 300 seconds, preferably 30 to 60 seconds.

The present invention is further explained by use of the following examples, but they by no means restrict embodiments of the present invention. In the description of the examples, "parts" and "%" mean "weight parts" and "wt %", respectively, unless otherwise noted.

Example 1

Synthesis of AMMA/TBMA/MAA (40/20/40) Terpolymer

In a reaction vessel equipped with a stirrer, a condenser, a heater and a thermostat, N,N'-dimethylformamide (500 parts) and methyl amyl ketone (500 parts) were placed. The solvent was purged with nitrogen gas for 30 minutes, and then heated to 90° C.

Independently, 9-anthracene-methyl methacrylate (AMMA, 1735 parts), tert-butyl methacrylate (TBMA, 447 parts), methacrylic acid (MAA, 542 parts), dimethyl 2,2'-azobis(2-methylisobutylate) (radical polymerization initiator, 273 parts), N,N'-dimethylformamide (3000 parts) and methyl amyl ketone (3000 parts) were placed in a sample container and then stirred. The obtained mixture solution was purged with nitrogen gas for 30 minutes.

The mixture solution was then introduced into the reaction vessel over a period of 2 hours by means of a peristaltic pump. After the introduction was completed, the reaction mixture was kept at 90° C. for 4 hours.

After cooled to room temperature, the mixture was poured into n-heptane (50000 parts). The top clear portion was removed and the left reaction mixture was dissolved in tetrahydrofuran (7000 parts). The obtained solution was poured into water (50000 parts) to form white precipitates. The precipitates were isolated by filtration under reduced pressure, and dried overnight in a vacuum oven at 50° C.

As a result of drying, AMMA/TBMA/MAA (40/20/40) terpolymer in an amount of 2537 parts (yield: 93%) was obtained in the form of white powder. The molecular weight of the product was measured by means of GPC (THF), to find that the product had a weight average molecular weight Mw of 6182 Da, a number average molecular weight Mn of 3373 Da and a polydispersity index PDI of 1.83.

Preparation of Composition [A] for Forming a Bottom Anti-Reflective Coating

To the polymer of Example 1 (90 parts), N,N'-1,3-phenylenedimaleimide (14 parts), triphenylsulfonium salt (2 parts), propyleneglycol monomethyl ether acetate (1713 parts), propyleneglycol monomethyl ether (2936 parts) and γ-butyrolactone (245 parts) were added. The mixture was stirred for 30 minutes at room temperature, to prepare a composition [A] for forming a bottom anti-reflective coating.

Evaluation of Composition [A] for Forming a Bottom Anti-Reflective Coating

The composition [A] for forming a bottom anti-reflective coating was spread by spin-coating on a silicon microchip wafer; and crosslinked by heating at 180° C. for 60 seconds on a vacuum hot-plate to obtain a bottom anti-reflective coating. The obtained coating was measured by means of ellipsometer, and it was found that the refractive index (n value) and the extinction coefficient (k value) at 248 nm were 1.59 and 0.35, respectively. The refractive index (n value) and the extinction coefficient (k value) at 193 nm were also found to be 1.67 and 0.34, respectively.

Independently, the above procedure was repeated and the composition was baked at 180° C. to form a bottom anti-reflective coating. It was verified that the formed coating was insoluble in any of ethyl lactate, propyleneglycol monomethyl ether acetate and propyleneglycol monomethyl ether.

Successively, on the obtained bottom anti-reflective coating, a commercially available 248 nm positive-working photoresist was spin-coated. The formed resist layer was soft-baked on a vacuum hot-plate at 120° C. for 60 seconds, and then imagewise exposed to radiation of 248 nm through a photomask. After subjected to post-exposure baking at 130° C. for 60 seconds, the resist layer was developed with a 2.38 wt % TMAH aqueous solution. As a result of this development, both of the photoresist layer and the bottom anti-reflective coating were removed in the area demarcated by the photomask. In the area, exposed to radiation, the anti-reflective coating was dissolved together with the photoresist and any residue of the coating was not observed. The formed pattern had a cross section in which both of the photoresist and the bottom anti-reflective coating showed rectangular side-faces perpendicular to the substrate surface.

Example 2

Synthesis of AMMA/MAA (40/60) Copolymer

In a reaction vessel equipped with a stirrer, a condenser, a heater and a thermostat, N,N'-dimethylformamide (150 parts) and methyl amyl ketone (150 parts) were placed. The solvent was purged with nitrogen gas for 30 minutes, and then heated to 120° C.

Independently, 9-anthracene-methyl methacrylate (AMMA, 558 parts), methacrylic acid (MAA, 267 parts), dimethyl 2,2'-azobis(2-methylisobutylate) (radical polymerization initiator, 83 parts), N,N'-dimethylformamide (900 parts) and methyl amyl ketone (900 parts) were placed in a sample container and then stirred. The obtained mixture solution was purged with nitrogen gas for 30 minutes.

The mixture solution was then introduced into the reaction vessel for 2 hours by means of a peristaltic pump. After the introduction was completed, the reaction mixture was kept at 120° C. for 4 hours.

After the mixture was cooled to room temperature, n-heptane (15000 parts) was added and then the top clear portion was removed. The left reaction mixture was dissolved in tetrahydrofuran (2000 parts). To the obtained solution, water (15000 parts) was added to form white precipitates. The precipitates were isolated by filtration under reduced pressure, and dried overnight in a vacuum oven at 50° C.

As a result of drying, AMMA/MAA (40/60) copolymer in an amount of 780 parts (yield: 96%) was obtained in the form of white powder. The molecular weight of the product was measured by means of GPC (THF), to find that the product had a weight average molecular weight Mw of 6389 Da, a number average molecular weight Mn of 2159 Da and a polydispersity index PDI of 2.96.

Preparation of Composition [B] for Forming a Bottom Anti-Reflective Coating

To the polymer of Example 2 (90 parts), N,N'-1,3-phenylenedimaleimide (14 parts), propyleneglycol monomethyl ether acetate (1713 parts), propyleneglycol monomethyl ether (2936 parts) and γ-butyrolactone (245 parts) were added. The mixture was stirred for 30 minutes at room temperature, to prepare a composition [B] for forming a bottom anti-reflective coating.

Evaluation of Composition [B] for Forming a Bottom Anti-Reflective Coating

The composition [B] for forming a bottom anti-reflective coating was spread by spin-coating on a silicon microchip wafer, and crosslinked by heating at 180° C. for 60 seconds on a vacuum hot-plate to obtain a bottom anti-reflective coating. The obtained coating was measured by means of ellipsometer, and it was found that the refractive index (n value) and the extinction coefficient (k value) at 248 nm were 1.60 and 0.34, respectively. The refractive index (n value) and the extinction coefficient (k value) at 193 nm were also found to be 1.65 and 0.36, respectively.

Independently, the above procedure was repeated and the composition was baked at 180° C. to form a bottom anti-reflective coating. It was verified that the formed coating was insoluble in any of ethyl lactate, propyleneglycol monomethyl ether acetate and propyleneglycol monomethyl ether.

Successively, on the obtained bottom anti-reflective coating, a commercially available 248 nm positive-working photoresist was spin-coated. The formed resist layer was soft-baked on a vacuum hot-plate at 120° C. for 60 seconds, and then imagewise exposed to radiation of 248 nm through a photomask. After subjected to post-exposure baking at 130° C. for 60 seconds, the resist layer was developed with a 2.38 wt % TMAH aqueous solution. As a result of this development, both of the photoresist layer and the bottom anti-reflective coating were removed in the area demarcated by the photomask. In the area exposed to radiation, the anti-reflective coating was dissolved together with the photoresist and any residue of the coating was not observed. The formed pattern had a cross section in which both of the photoresist and the bottom anti-reflective coating showed rectangular side-faces perpendicular to the substrate surface.

Example 3

Preparation of Composition [C] for Forming a Bottom Anti-Reflective Coating

To the polymer of Example 2 (90 parts), N,N'-1,3-phenylenedimaleimide (14 parts), triphenylsulfonium salt (2 parts), a crosslinking agent for electronics material (methylated urea resin MX-270 [trademark], manufactured by Sanwa Chemical Co., Ltd.) (14 parts), propyleneglycol monomethyl ether acetate (1713 parts), propyleneglycol monomethyl ether (2936 parts) and γ-butyrolactone (245 parts) were added. The mixture was stirred for 30 minutes at room temperature, to prepare a composition [C] for forming a bottom anti-reflective coating.

Evaluation of Composition [C] for Forming a Bottom Anti-Reflective Coating

The composition [C] for forming a bottom anti-reflective coating was spread by spin-coating on a silicon microchip wafer, and crosslinked by heating at 180° C. for 60 seconds on a vacuum hot-plate to obtain a bottom anti-reflective coating. The obtained coating was measured by means of ellipsometer, and it was found that the refractive index (n value) and the extinction coefficient (k value) at 248 nm were 1.60 and 0.34, respectively. The refractive index (n value) and the extinction coefficient (k value) at 193 nm were also found to be 1.65 and 0.36, respectively.

Independently, the above procedure was repeated and the composition was baked at 180° C. to form a bottom anti-reflective coating. It was verified that the formed coating was insoluble in any of ethyl lactate, propyleneglycol monomethyl ether acetate and propyleneglycol monomethyl ether.

Successively, on the obtained bottom anti-reflective coating, a commercially available 248 nm negative-working photoresist was spin-coated. The formed resist layer was softbaked on a vacuum hot-plate at 120° C. for 60 seconds, and then imagewise exposed to radiation of 248 nm through a photomask. After subjected to post-exposure baking at 130° C. for 60 seconds, the resist layer was developed with a 2.38 wt % TMAH aqueous solution. As a result of this development, both of the photoresist layer and the bottom anti-reflective coating were removed in the area not demarcated by the photomask. In the area not exposed to radiation, the anti-reflective coating was dissolved together with the photoresist and any residue of the coating was not observed. The formed pattern had a cross section in which both of the photoresist and the bottom anti-reflective coating showed rectangular side-faces perpendicular to the substrate surface.

Example 4

Preparation of Composition [D] for Forming a Bottom Anti-Reflective Coating

To the polymer of Example 2 (90 parts), N,N'-1,3-phenylenedimaleimide (14 parts), propyleneglycol monomethyl ether acetate (1713 parts), propyleneglycol monomethyl ether (2936 parts) and γ-butyrolactone (245 parts) were added. The mixture was stirred for 30 minutes at room temperature, to prepare a composition [D] for forming a bottom anti-reflective coating.

Evaluation of Composition [D] for Forming a Bottom Anti-Reflective Coating

The composition [D] for forming a bottom anti-reflective coating was spread by spin-coating on a silicon microchip wafer, and crosslinked by heating at 180° C. for 60 seconds on a vacuum hot-plate to obtain a bottom anti-reflective coating. The obtained coating was measured by means of ellipsometer, and it was found that the refractive index (n value) and the extinction coefficient (k value) at 248 nm were 1.60 and 0.34, respectively. The refractive index (n value) and the extinction coefficient (k value) at 193 nm were also found to be 1.65 and 0.36, respectively.

Independently, the above procedure was repeated and the composition was baked at 180° C. to form a bottom anti-reflective coating. It was verified that the formed coating was insoluble in any of ethyl lactate, propyleneglycol monomethyl ether acetate and propyleneglycol monomethyl ether.

Successively, on the obtained bottom anti-reflective coating, a commercially available 248 nm negative-working photoresist was spin-coated. The formed resist layer was soft-baked on a vacuum hot-plate at 120° C. for 60 seconds, and then imagewise exposed to radiation of 248 nm through a photomask. After subjected to post-exposure baking at 130° C. for 60 seconds, the resist layer was developed with a 2.38 wt % TMAH aqueous solution. As a result of this development, both of the photoresist layer and the bottom anti-reflective coating were removed in the area not demarcated by the photomask. In the area not exposed to radiation, the anti-reflective coating was dissolved together with the photoresist and any residue of the coating was not observed. The formed pattern had a cross section in which both of the photoresist and the bottom anti-reflective coating showed rectangular side-faces perpendicular to the substrate surface.

Example 5

Preparation of Composition [E] for Forming a Bottom Anti-Reflective Coating

To the polymer of Example 1 (90 parts), N,N'-1,3-phenylenedimaleimide (14 parts), triphenylsulfonium salt (2 parts), propyleneglycol monomethyl ether acetate (1713 parts), propyleneglycol monomethyl ether (2936 parts) and γ-butyrolactone (245 parts) were added. The mixture was stirred for 30 minutes at room temperature, to prepare a composition [E] for forming a bottom anti-reflective coating.

Evaluation of Composition [E] for Forming a Bottom Anti-Reflective Coating

The composition [E] for forming a bottom anti-reflective coating was spread by spin-coating on a silicon microchip wafer, and crosslinked by heating at 180° C. for 60 seconds on a vacuum hot-plate to obtain a bottom anti-reflective coating. The obtained coating was measured by means of ellipsometer, and it was found that the refractive index (n value) and the extinction coefficient (k value) at 248 nm were 1.59 and 0.35, respectively. The refractive index (n value) and the extinction coefficient (k value) at 193 nm were also found to be 1.67 and 0.34, respectively.

Independently, the above procedure was repeated and the composition was baked at 180° C. to form a bottom anti-reflective coating. It was verified that the formed coating was soluble in methyl amyl ketone but insoluble in any of ethyl lactate, propyleneglycol monomethyl ether acetate and propyleneglycol monomethyl ether.

Successively, on the obtained bottom anti-reflective coating, a commercially available 248 nm positive-working photoresist was spin-coated. The formed resist layer was soft-baked on a vacuum hot-plate at 120° C. for 60 seconds, and then imagewise exposed to radiation of 248 nm through a photomask. After subjected to post-exposure baking at 130° C. for 60 seconds, the resist layer was developed with methyl amyl ketone. As a result of this development, both of the photoresist layer and the bottom anti-reflective coating were removed in the area not demarcated by the photomask. In the area not exposed to radiation, the anti-reflective coating was dissolved together with the photoresist and any residue of the coating was not observed. The formed pattern had a cross section in which both of the photoresist and the bottom anti-reflective coating showed rectangular side-faces perpendicular to the substrate surface.

Example 6

Preparation of Composition [F] for Forming a Bottom Anti-Reflective Coating

To the polymer of Example 1 (90 parts), N-phenyl-maleimide (28 parts), triphenylsulfonium salt (2 parts), propyleneglycol monomethyl ether acetate (1713 parts), propyleneglycol monomethyl ether (2936 parts) and γ-butyrolactone (245 parts) were added. The mixture was stirred for 30 minutes at room temperature, to prepare a composition [F] for forming a bottom anti-reflective coating.

Evaluation of Composition [F] for Forming a Bottom Anti-Reflective Coating

The composition [F] for forming a bottom anti-reflective coating was spread by spin-coating on a silicon microchip wafer, and crosslinked by heating at 180° C. for 60 seconds on a vacuum hot-plate to obtain a bottom anti-reflective coating. The obtained coating was measured by means of ellipsometer, and it was found that the refractive index (n value) and the extinction coefficient (k value) at 248 nm were 1.55 and 0.36, respectively. The refractive index (n value) and the extinction coefficient (k value) at 193 nm were also found to be 1.67 and 0.34, respectively.

Independently, the above procedure was repeated and the composition was baked at 180° C. to form a bottom anti-reflective coating. It was verified that the formed coating was soluble only slightly enough to use practically in any of ethyl lactate, propyleneglycol monomethyl ether acetate and propyleneglycol monomethyl ether.

Successively, on the obtained bottom anti-reflective coating, a commercially available 248 nm positive-working photoresist was spin-coated. The formed resist layer was soft-baked on a vacuum hot-plate at 120° C. for 60 seconds, and then imagewise exposed to radiation of 248 nm through a photomask. After subjected to post-exposure baking at 130° C. for 60 seconds, the resist layer was developed with a 2.38 wt % TMAH aqueous solution. As a result of this development, both of the photoresist layer and the bottom anti-reflective coating were removed in the area demarcated by the photomask. In the area exposed to radiation, the anti-reflective coating was dissolved together with the photoresist and any residue of the coating was not observed. The formed pattern had a cross section in which the photoresist and the bottom anti-reflective coating showed side-faces in such slightly undercut and fitting shapes, respectively, as were practically usable without any troubles.

Example 7

Preparation of Composition [G] for Forming a Bottom Anti-Reflective Coating

To the polymer of Example 1 (90 parts), maleic anhydride (28 parts), triphenylsulfonium salt (2 parts), propyleneglycol monomethyl ether acetate (1713 parts), propyleneglycol monomethyl ether (2936 parts) and γ-butyrolactone (245 parts) were added. The mixture was stirred for 30 minutes at room temperature, to prepare a composition [G] for forming a bottom anti-reflective coating.

Evaluation of Composition [G] for Forming a Bottom Anti-Reflective Coating

The composition [G] for forming a bottom anti-reflective coating was spread by spin-coating on a silicon microchip wafer, and crosslinked by heating at 180° C. for 60 seconds on a vacuum hot-plate to obtain a bottom anti-reflective coating. The obtained coating was measured by means of ellipsometer, and it was found that the refractive index (n value) and the extinction coefficient (k value) at 248 nm were 1.52 and 0.38, respectively. The refractive index (n value) and the extinction coefficient (k value) at 193 nm were also found to be 1.67 and 0.34, respectively.

Independently, the above procedure was repeated and the composition was baked at 180° C. to form a bottom anti-reflective coating. It was verified that the formed coating was soluble only slightly enough to use practically in any of ethyl lactate, propyleneglycol monomethyl ether acetate and propyleneglycol monomethyl ether.

Successively, on the obtained bottom anti-reflective coating, a commercially available 248 nm positive-working photoresist was spin-coated. The formed resist layer was soft-baked on a vacuum hot-plate at 120° C. for 60 seconds, and then imagewise exposed to radiation of 248 nm through a photomask. After subjected to post-exposure baking at 130° C. for 60 seconds, the resist layer was developed with a 2.38 wt % TMAH aqueous solution. As a result of this development, both of the photoresist layer and the bottom anti-reflective coating were removed in the area demarcated by the photomask. In the area exposed to radiation, the anti-reflective coating was dissolved together with the photoresist and any residue of the coating was not observed. The formed pattern had a cross section in which the photoresist and the bottom anti-reflective coating showed side-faces in such slightly undercut and fitting shapes, respectively, as were practically usable without any troubles.

Example 8

Preparation of Composition [H] for Forming a Bottom Anti-Reflective Coating

To the polymer of Example 1 (90 parts), N,N'-1,3-phenylenedimaleimide (14 parts), propyleneglycol monomethyl ether acetate (1713 parts), propyleneglycol monomethyl ether (2936 parts) and γ-butyrolactone (245 parts) were added. The mixture was stirred for 30 minutes at room temperature, to prepare a composition [H] for forming a bottom anti-reflective coating.

Evaluation of Composition [H] for Forming a Bottom Anti-Reflective Coating

The composition [H] for forming a bottom anti-reflective coating was spread by spin-coating on a silicon microchip wafer, and crosslinked by heating at 180° C. for 60 seconds on a vacuum hot-plate to obtain a bottom anti-reflective coating. The obtained coating was measured by means of ellipsometer, and it was found that the refractive index (n value) and the extinction coefficient (k value) at 248 nm were 1.59 and 0.35, respectively. The refractive index (n value) and the extinction coefficient (k value) at 193 nm were also found to be 1.67 and 0.34, respectively.

Independently, the above procedure was repeated and the composition was baked at 180° C. to form a bottom anti-reflective coating. It was verified that the formed coating was insoluble in any of ethyl lactate, propyleneglycol monomethyl ether acetate and propyleneglycol monomethyl ether.

Successively, on the obtained bottom anti-reflective coating, a commercially available 248 nm positive-working photoresist was spin-coated. The formed resist layer was soft-baked on a vacuum hot-plate at 120° C. for 60 seconds, and then imagewise exposed to radiation of 248 nm through a photomask. After subjected to post-exposure baking at 130° C. for 60 seconds, the resist layer was developed with a 2.38 wt % TMAH aqueous solution. As a result of this development, both of the photoresist layer and the bottom anti-reflective coating were removed in the area demarcated by the photomask. In the area exposed to radiation, the anti-reflective coating was dissolved together with the photoresist and any residue of the coating was not observed. The formed pattern had a cross section in which both of the photoresist and the bottom anti-reflective coating showed rectangular side-faces perpendicular to the substrate surface.

Example 9

Preparation of Composition [I] for Forming a Bottom Anti-Reflective Coating

To the polymer of Example 2 (90 parts), N,N'-1,3-phenylenedimaleimide (14 parts), a crosslinking agent for electronics material (methylated urea resin MX-270 [trademark], manufactured by Sanwa Chemical Co., Ltd.) (14 parts), propyleneglycol monomethyl ether acetate (1713 parts), propyleneglycol monomethyl ether (2936 parts) and γ-butyrolactone (245 parts) were added. The mixture was stirred for 30 minutes at room temperature, to prepare a composition [I] for forming a bottom anti-reflective coating.

Evaluation of Composition [I] for Forming a Bottom Anti-Reflective Coating

The composition [I] for forming a bottom anti-reflective coating was spread by spin-coating on a silicon microchip wafer, and crosslinked by heating at 180° C. for 60 seconds on a vacuum hot-plate to obtain a bottom anti-reflective coating. The obtained coating was measured by means of ellipsometer, and it was found that the refractive index (n value) and the extinction coefficient (k value) at 248 nm were 1.60 and 0.34, respectively. The refractive index (n value) and the extinction coefficient (k value) at 193 nm were also found to be 1.65 and 0.36, respectively.

Independently, the above procedure was repeated and the composition was baked at 180° C. to form a bottom anti-reflective coating. It was verified that the formed coating was insoluble in any of ethyl lactate, propyleneglycol monomethyl ether acetate and propyleneglycol monomethyl ether.

Successively, on the obtained bottom anti-reflective coating, a commercially available 248 nm negative-working photoresist was spin-coated. The formed resist layer was soft-baked on a vacuum hot-plate at 120° C. for 60 seconds, and then imagewise exposed to radiation of 248 nm through a photomask. After subjected to post-exposure baking at 130° C. for 60 seconds, the resist layer was developed with a 2.38 wt % TMAH aqueous solution. As a result of this development, both of the photoresist layer and the bottom anti-reflective coating were removed in the area not demarcated by the photomask. In the area not exposed to radiation, the anti-reflective coating was dissolved together with the photoresist and any residue of the coating was not observed. The formed pattern had a cross section in which both of the photoresist and the bottom anti-reflective coating showed rectangular side-faces perpendicular to the substrate surface.

Example 10

Preparation of Composition [3] for Forming a Bottom Anti-Reflective Coating

To the polymer of Example 1 (90 parts), N,N'-1,3-phenylenedimaleimide (14 parts), propyleneglycol monomethyl ether acetate (1713 parts), propyleneglycol monomethyl ether (2936 parts) and γ-butyrolactone (245 parts) were added. The mixture was stirred for 30 minutes at room temperature, to prepare a composition [3] for forming a bottom anti-reflective coating.

Evaluation of Composition [3] for Forming a Bottom Anti-Reflective Coating

The composition [J] for forming a bottom anti-reflective coating was spread by spin-coating on a silicon microchip wafer, and crosslinked by heating at 180° C. for 60 seconds on a vacuum hot-plate to obtain a bottom anti-reflective coating. The obtained coating was measured by means of ellipsometer, and it was found that the refractive index (n value) and the extinction coefficient (k value) at 248 nm were 1.59 and 0.35, respectively. The refractive index (n value) and the extinction coefficient (k value) at 193 nm were also found to be 1.67 and 0.34, respectively.

Independently, the above procedure was repeated and the composition was baked at 180° C. to form a bottom anti-reflective coating. It was verified that the formed coating was soluble in methyl amyl ketone but insoluble in any of ethyl lactate, propyleneglycol monomethyl ether acetate and propyleneglycol monomethyl ether.

Successively, on the obtained bottom anti-reflective coating, a commercially available 248 nm positive-working photoresist was spin-coated. The formed resist layer was soft-baked on a vacuum hot-plate at 120° C. for 60 seconds, and then imagewise exposed to radiation of 248 nm through a photomask. After subjected to post-exposure baking at 130° C. for 60 seconds, the resist layer was developed with methyl amyl ketone. As a result of this development, both of the photoresist layer and the bottom anti-reflective coating were removed in the area not demarcated by the photomask. In the area not exposed to radiation, the anti-reflective coating was dissolved together with the photoresist and any residue of the coating was not observed. The formed pattern had a cross section in which both of the photoresist and the bottom anti-reflective coating showed rectangular side-faces perpendicular to the substrate surface.

Example 11

Synthesis of AMMA/TBMA/MI (36/50/14) Terpolymer

In a reaction vessel equipped with a stirrer, a condenser, a heater and a thermostat, N,N'-dimethylformamide (500 parts) and methyl amyl ketone (500 parts) were placed. The solvent was purged with nitrogen gas for 30 minutes, and then heated to 90° C.

Independently, 9-anthracene-methyl methacrylate (AMMA, 1543 parts), tert-butyl methacrylate (TBMA, 1103 parts), maleimide (MI, 211 parts), dimethyl 2,2'-azobis(2-methylisobutylate) (radical polymerization initiator, 143 parts), N,N'-dimethylformamide (3000 parts) and methyl amyl ketone (3000 parts) were placed in a sample container and then stirred. The obtained mixture solution was purged with nitrogen gas for 30 minutes.

The mixture solution was then introduced into the reaction vessel for 2 hours by means of a peristaltic pump. After the introduction was completed, the reaction mixture was kept at 90° C. for 4 hours.

After the mixture was cooled to room temperature, n-heptane (50000 parts) was added and then the top clear portion was removed. The left reaction mixture was dissolved in tetrahydrofuran (7000 parts). To the obtained solution, water (50000 parts) was added to form white precipitates. The precipitates were isolated by filtration under reduced pressure, and dried overnight in a vacuum oven at 50° C.

As a result of drying, AMMA/TBMA/MI (36/50/14) terpolymer in an amount of 2540 parts (yield: 93%) was obtained in the form of white powder. The molecular weight of the product was measured by means of GPC (THF), to find that the product had a weight average molecular weight Mw of 6232 Da, a number average molecular weight Mn of 3373 Da and a polydispersity index PIM of 1.91.

Preparation of Composition [K] for Forming a Bottom Anti-Reflective Coating

To the polymer of Example 11 (180 parts), triphenylsulfonium salt (2 parts), propyleneglycol monomethyl ether acetate (4891 parts) and propyleneglycol monomethyl ether (4891 parts) were added. The mixture was stirred for 30 minutes at room temperature, to prepare a composition [K] for forming a bottom anti-reflective coating.

Evaluation of Composition [K] for Forming a Bottom Anti-Reflective Coating

The composition [K] for forming a bottom anti-reflective coating was spread by spin-coating on a silicon microchip wafer, and crosslinked by heating at 180° C. for 60 seconds on a vacuum hot-plate to obtain a bottom anti-reflective coating. The obtained coating was measured by means of ellipsometer, and it was found that the refractive index (n value) and the extinction coefficient (k value) at 248 nm were 1.49 and 0.61, respectively. The refractive index (n value) and the extinction coefficient (k value) at 193 nm were also found to be 1.68 and 0.28, respectively.

Independently, the above procedure was repeated and the composition was baked at 180° C. to form a bottom anti-reflective coating. It was verified that the formed coating was slightly soluble in any of ethyl lactate, propyleneglycol monomethyl ether acetate and propyleneglycol monomethyl ether.

Successively, on the obtained bottom anti-reflective coating, a commercially available 248 nm positive-working photoresist was spin-coated. The formed resist layer was soft-baked on a vacuum hot-plate at 120° C. for 60 seconds, and then imagewise exposed to radiation of 248 nm through a photomask. After subjected to post-exposure baking at 130° C. for 60 seconds, the resist layer was developed with a 2.38 wt % TMAH aqueous solution. As a result of this development, both of the photoresist layer and the bottom anti-reflective coating were removed in the area demarcated by the photomask. In the area exposed to radiation, the anti-reflective coating was dissolved together with the photoresist and any residue of the coating was not observed. The formed pattern had a cross section in which the photoresist and the bottom anti-reflective coating showed side-faces in slightly undercut and fitting shapes, respectively. Further, the sidefaces were not perpendicular to the substrate surface.

Comparative Example 1

According to the method described in Patent document 2, a polymer and a composition for forming a bottom anti-reflective coating were produced.

Synthesis of MI/AMMA/HNMA-2/TBA (34.3/31.5/25.0/9.2) Tetrapolymer

In a round-bottom flask equipped with a mechanical stirrer, a condenser, a heater and a thermostat, dioxane (215 parts) was placed. The solvent was purged with nitrogen gas for 15 minutes, and then heated to 85° C.

Independently, in an Erlenmeyer flask equipped with a stirring rod, maleimide (MI, 53.10 parts), 9-anthracene-methyl methacrylate (AMMA, 138.7 parts), 2-hydroxynaphthalene-methyl methacrylate monomer (HNMA-2, 96.53 parts), t-butyl acrylate (TBA, 18.80 parts) and dioxane (423.5 parts) were placed. The mixture solution was stirred for 30 minutes at room temperature, and then purged with nitrogen gas for 15 minutes to prepare a monomer solution.

Further separately from the above, in a 500-mL vessel, 2,2-azobis(2,4-dimethylvaleronitrile) (11.89 parts) and dioxane (78.0 parts) were placed and mixed to prepare an initiator solution.

The monomer solution was then introduced into the round-bottom flask at the rate of 8.5 g/minute for 1.5 hours by means of a peristaltic pump. At the same time, the initiator solution was also introduced into the round-bottom flask at the rate of 1.1 g/minute for 90 minutes by means of a peristaltic pump.

After the introduction of the monomer and initiator solutions was completed, a mixture of 2,2-azobis(2,4-dimethylvaleronitrile) (7.93 parts) and dioxane (151 parts) was introduced into the round-bottom flask at the rate of 8.0 g/minute for 20 minutes by means of a peristaltic pump. Thereafter, the reaction mixture was kept at 85° C. for 1.5 hours.

After the mixture was cooled to room temperature, 15.0 L of methanol was added to precipitate a white product. The white precipitates were isolated by filtration under reduced pressure, washed with 3.0 parts of methanol, and then dried overnight in a vacuum oven at 50° C. As a result, the titled polymer in the form of white powder was obtained in the yield of 64%. The molecular weight of the product was measured by means of GPC (THF), to find that the product had a weight average molecular weight Mw of 9300 Da, a number average molecular weight Mn of 6500 Da and a polydispersity index PDI of 1.5.

Preparation of Composition [L] for Forming a Bottom Anti-Reflective Coating

The polymer of Comparative Example 1 (90 parts), triphenylsulfonium salt (2 parts) and ethyl lactate (4894 parts) were mixed and stirred for 30 minutes at room temperature, to prepare a composition [L] for forming a bottom anti-reflective coating.

Evaluation of Composition [L] for Forming a Bottom Anti-Reflective Coating

The composition [L] for forming a bottom anti-reflective coating was spread by spin-coating on a silicon microchip wafer, and hardened by heating at 180° C. and 210° C. for 60 seconds each on a vacuum hot-plate to obtain a bottom anti-reflective coating.

It was verified that the obtained bottom anti-reflective coating was very soluble in any of ethyl lactate, propyleneglycol monomethyl ether acetate and propyleneglycol monomethyl ether, as compared with the coatings of Examples 1 to 11. Further, a photoresist layer was formed on the obtained coating and then developed. However, the bottom anti-reflective coating was dissolved in a developing solution so readily that the resist layer peeled off from the substrate, and consequently it was impossible to form a pattern.

Example 12

Synthesis of AMMA Homo-polymer

In a reaction vessel equipped with a stirrer, a condenser, a heater and a thermostat, propyleneglycol monomethyl ether acetate (1000 parts) was placed. The solvent was purged with nitrogen gas for 30 minutes, and then heated to 90° C.

Independently, 9-anthracene-methyl methacrylate (AMMA, 2727 parts), dimethyl 2,2'-azobis(2-methylisobutylate) (radical polymerization initiator, 273 parts), and propyleneglycol monomethyl ether acetate (6000 parts) were placed in a sample container and then stirred. The obtained monomer solution was purged with nitrogen gas for 30 minutes.

The monomer solution was then introduced into the reaction vessel over a period of 2 hours by means of a peristaltic pump. After the introduction was completed, the reaction mixture was kept at 90° C. for 4 hours.

After cooled to room temperature, the mixture was poured into n-heptane (50000 parts). The top clear portion was removed and the left reaction mixture was dissolved in tetrahydrofuran (7000 parts). The obtained solution was poured into water (50000 parts) to form white precipitates. The precipitates were isolated by filtration under reduced pressure, and dried overnight in a vacuum oven at 50° C.

As a result of drying, AMMA homo-polymer in an amount of 2537 parts (yield: 93%) was obtained in the form of white powder. The molecular weight of the product was measured by means of GPC (THF), to find that the product had a weight average molecular weight Mw of 4230 Da, a number average molecular weight Mn of 2350 Da and a polydispersity index PDI of 1.80.

Preparation of Composition [M] for Forming a Bottom Anti-Reflective Coating

To the polymer of Example 1 (90 parts), N,N'-1,3-phenylenedimaleimide (30 parts), propyleneglycol monomethyl ether acetate (1713 parts), propyleneglycol monomethyl ether (2936 parts) and γ-butyrolactone (245 parts) were added. The mixture was stirred for 30 minutes at room temperature, to prepare a composition [M] for forming a bottom anti-reflective coating.

Evaluation of Composition [M] for Forming a Bottom Anti-Reflective Coating

The composition [M] for forming a bottom anti-reflective coating was cast by spin-coating on a silicon microchip wafer, and crosslinked by heating at 180° C. for 60 seconds on a vacuum hot-plate to obtain a bottom anti-reflective coating. The obtained coating was measured by means of ellipsometer, and it was found that the refractive index (n value) and the extinction coefficient (k value) at 248 nm were 1.58 and 0.35, respectively. The refractive index (n value) and the extinction coefficient (k value) at 193 nm were also found to be 1.67 and 0.32, respectively.

Independently, the above procedure was repeated and the composition was baked at 180° C. to form a bottom anti-reflective coating. It was verified that the formed coating was insoluble in any of ethyl lactate, propyleneglycol monomethyl ether acetate and propyleneglycol monomethyl ether.

Successively, on the obtained bottom anti-reflective coating, a commercially available 248 nm positive-working photoresist was spin-coated. The formed resist layer was soft-baked on a vacuum hot-plate at 120° C. for 60 seconds, and then imagewise exposed to radiation of 248 nm through a photomask. After subjected to post-exposure baking at 130° C. for 60 seconds, the resist layer was developed with a 2.38 wt % TMAH aqueous solution. As a result of this development, the photoresist layer was removed in the area demarcated by the photomask. The formed pattern had a rectangular cross section perpendicular to the substrate surface.

Example 13

Preparation of Composition [N] for Forming a Bottom Anti-Reflective Coating)

To the polymer of Example 12 (90 parts), N,N'-1,3-phenylenedimaleimide (30 parts), propyleneglycol monomethyl ether acetate (1713 parts), propyleneglycol monomethyl ether (2936 parts) and γ-butyrolactone (245 parts) were added. The mixture was stirred for 30 minutes at room temperature, to prepare a composition [N] for forming a bottom anti-reflective coating.

Evaluation of Composition [N] for Forming a Bottom Anti-Reflective Coating

The composition [N] for forming a bottom anti-reflective coating was cast by spin-coating on a silicon microchip wafer, and crosslinked by heating at 180° C. for 60 seconds on a vacuum hot-plate to obtain a bottom anti-reflective coating. The obtained coating was measured by means of ellipsometer, and it was found that the refractive index (n value) and the extinction coefficient (k value) at 248 nm were 1.60 and 0.34, respectively. The refractive index (n value) and the extinction coefficient (k value) at 193 nm were also found to be 1.65 and 0.36, respectively.

Independently, the above procedure was repeated and the composition was baked at 180° C. to form a bottom anti-reflective coating. It was verified that the formed coating was insoluble in any of ethyl lactate, propyleneglycol monomethyl ether acetate and propyleneglycol monomethyl ether.

Successively, on the obtained bottom anti-reflective coating, a commercially available 248 nm negative-working photoresist was spin-coated. The formed resist layer was soft-baked on a vacuum hot-plate at 120° C. for 60 seconds, and then imagewise exposed to radiation of 248 nm through a photomask. After subjected to post-exposure baking at 130° C. for 60 seconds, the resist layer was developed with a 2.38 wt % TMAH aqueous solution. As a result of this development, the photoresist layer was removed in the area not demarcated by the photomask. The formed pattern had a cross section in which the photoresist showed a rectangular sideface perpendicular to the substrate surface.

Example 14

Preparation of Composition [O] for Forming a Bottom Anti-Reflective Coating

To the polymer of Example 12 (90 parts), N,N'-1,3-phenylenedimaleimide (14 parts), propyleneglycol monomethyl ether acetate (1713 parts), propyleneglycol monomethyl ether (2936 parts) and γ-butyrolactone (245 parts) were added. The mixture was stirred for 30 minutes at room temperature, to prepare a composition [O] for forming a bottom anti-reflective coating.

Evaluation of Composition [O] for Forming a Bottom Anti-Reflective Coating

The composition [O] for forming a bottom anti-reflective coating was cast by spin-coating on a silicon microchip wafer, and crosslinked by heating at 180° C. for 60 seconds on a vacuum hot-plate, to obtain a bottom anti-reflective coating. The obtained coating was measured by means of ellipsometer, and it was found that the refractive index (n value) and the extinction coefficient (k value) at 248 nm were 1.58 and 0.35, respectively. The refractive index (n value) and the extinction coefficient (k value) at 193 nm were also found to be 1.63 and 0.35, respectively.

Independently, the above procedure was repeated and the composition was baked at 180° C. to form a bottom anti-reflective coating. It was verified that the formed coating was insoluble in any of ethyl lactate, propyleneglycol monomethyl ether acetate, propyleneglycol monomethyl ether and methyl amyl ketone.

Successively, on the obtained bottom anti-reflective coating, a commercially available 248 nm positive-working photoresist was spin-coated. The formed resist layer was soft-baked on a vacuum hot-plate at 120° C. for 60 seconds, and then imagewise exposed to radiation of 248 nm through a photomask. After subjected to post-exposure baking at 130° C. for 60 seconds, the resist layer was developed with methyl amyl ketone. As a result of this development, the photoresist layer was removed in the area not demarcated by the photomask. The formed pattern had a cross section in which the photoresist showed a rectangular side-face perpendicular to the substrate surface.

Comparative Example 2

According to the method described in Patent document 5, a polymer and a composition for forming a bottom anti-reflective coating were produced.

Synthesis of TFEM/HEM Co-Polymer

After 15 g of 2,2,2-trifluoroethyl methacrylate (TFEM) and 15 g of 2-hydroxyethyl methacrylate (HEM) were dissolved in 120 g of ethyl lactate, the solution was heated at 70° C. and, at the same time, bubbled with nitrogen gas. Successively, 0.6 g of azobis(isobutyronitrile) was added as a polymerization initiator. The solution was stirred for 24 hours under nitrogen atmosphere, and then 0.01 g of 4-methoxyphenol was added as a polymerization terminator. Thereafter, the solution was poured into diethyl ether, to precipitate a resin compound. The molecular weight of the resin compound was measured by means of GPC, to find that the product had a weight average molecular weight of 20200 in terms of standard polystyrene.

Preparation of Composition [P] for Forming a Bottom Anti-Reflective Coating

After 18.42 g of 60% xylene/butanol solution of tetrabutoxy methyl urea oligomer composition (polymerization degree: 5) UFR300 ([trademark], manufactured by Mitsui Cytec Ltd.), 1.22 g of the above TFEM/HEM co-polymer and 0.33 g of p-toluenesulfonic acid were mixed, 186.9 g of ethyl lactate was poured therein. The obtained mixture was filtrated through a 0.10 µm porous size polyethylene-made micro-filter and further filtrated through a 0.05 µm porous size polyethylene-made micro-filter, to prepare a composition for forming a bottom anti-reflective coating.

Evaluation of Composition [P] for Forming a Bottom Anti-Reflective Coating

The composition for forming a bottom anti-reflective coating was cast by spin-coating on a silicon microchip wafer, and crosslinked by heating at 180° C. for 60 seconds and further at 205° C. for 60 seconds on a vacuum hot-plate, to obtain a dry bottom anti-reflective coating.

It was verified that the formed coating was slightly soluble, as compared with the coatings of Examples, in any of ethyl lactate, propyleneglycol monomethyl ether acetate and propyleneglycol monomethyl. Successively, on the obtained bottom anti-reflective coating, a commercially available positive-working photoresist was spin-coated. The formed resist layer was soft-baked on a vacuum hot-plate at 120° C. for 60 seconds, and then imagewise exposed to radiation through a photomask. After subjected to post-exposure baking at 115° C. or 130° C. for 60 seconds, the resist layer was developed with a 2.38 wt % TMAH aqueous solution. As a result of this development, the photoresist layer was removed in the area demarcated by the photomask. The formed pattern had a cross section in which the photoresist showed a slightly fitting and not perpendicular side-face.

Example 15

Synthesis of HNMA/AMMA/OTMA (60/25/15) Terpolymer

In a 250 mL round-bottom flask equipped with a magnetic stirrer, a condenser, a nitrogen inlet and a thermostat, 135 g of propyleneglycol monomethyl ether acetate (PGMEA) solvent was placed. The solvent was purged with nitrogen gas for 30 minutes, and then heated at 80° C. by means of a heating mantle. Independently, 16.7 g of 9-hydroxynaphthyl methacrylate (HNMA), 3.4 g of oxathianyl methacrylate (OTMA), 8.43 g of 9-anthracenemethyl methacrylate (AMMA), 1.44 g of azobis(isobutyronitrile) (AIBN) initiator and 135 g of PGMEA were mixed and purged with nitrogen gas for 30 minutes, to prepare a deaerated PGMEA solution. The obtained PGMEA solution was dropwise added over a period of 3 hours into the above heated solvent from a pressure equalizing dropping funnel. The reaction mixture was further kept heated at 80° C. for 3 hours, to promote the polymerization. Thereafter, the reaction mixture was cooled to room temperature under nitrogen atmosphere. When the temperature of the mixture reached down to 30° C., 4.5 g of methanol was added so as to terminate the reaction. The obtained PGMEA solution was poured into twice volumes of hexane, to precipitate the polymer. The precipitated polymer was collected and washed three times with a mixture of water and methanol, and then dried in a vacuum oven at 40° C. for 48 hours.

As a result of the above procedure, 21.24 g of the polymer was obtained (yield: 74.3%). The molecular weight of the product was measured, to find that the product had a weight average molecular weight Mw of 8661 Da, a number average molecular weight Mn of 4597 Da and a polydispersity index PDI of 1.88.

Preparation of Composition [Q] for Forming a Bottom Anti-Reflective Coating

To the polymer of Example 15 (1.667 parts), N,N'-1,3-phenylenedimaleimide (0.433 part), propyleneglycol monomethyl ether (PGME, 138.2 parts), cyclohexanone (8.221 parts) and γ-valerolactone (1.479 parts) were added. The mixture was stirred for 30 minutes at room temperature, to prepare a composition [Q] for forming a bottom anti-reflective coating.

Evaluation of Composition [Q] for Forming a Bottom Anti-Reflective Coating

The composition [Q] for forming a bottom anti-reflective coating was cast by spin-coating on a silicon microchip wafer, and crosslinked by heating at 190° C. for 60 seconds on a vacuum hot-plate, to obtain a bottom anti-reflective coating. The obtained coating was measured by means of ellipsometer, and it was found that the refractive index (n value) and the extinction coefficient (k value) at 248 nm were 1.9288 and 0.1629, respectively. The refractive index (n value) and the extinction coefficient (k value) at 193 nm were also found to be 1.5531 and 0.4113, respectively.

Independently, the above procedure was repeated and the composition was baked at 190° C. to form a bottom anti-reflective coating. It was verified that the formed coating was insoluble in either of ethyl lactate and a mixture of propyleneglycol monomethyl ether acetate (30) and propyleneglycol monomethyl ether (70).

Successively, on the obtained bottom anti-reflective coating, a commercially available 193 nm positive-working photoresist was spin-coated. The formed resist layer was soft-baked on a vacuum hot-plate under recommended conditions, and then imagewise exposed to radiation of 193 nm through a photomask. After subjected to post-exposure baking at a recommended temperature, the resist layer was developed with a 2.38 wt % TMAH aqueous solution. As a result of this development, the photoresist layer was removed in the area demarcated by the photomask. In the area exposed to radiation, the photoresist was dissolved away to leave the anti-reflective coating in tact. The formed pattern had a cross section in which the photoresist showed a rectangular side-face perpendicular to the substrate surface.

Example 16

Synthesis of PQMA/AMMA/EtCpMA (66/22.5/11.5) Terpolymer

In a 250 mL round-bottom flask equipped with a mechanical stirrer, a condenser, a nitrogen inlet and a thermostat, 384 g of propyleneglycol monomethyl ether acetate (PGMEA) solvent, 6.24 g of 2-ethylcyclopentyl methacrylate (EtCpMA), 34.99 g of 4-hydroxyphenyl methacrylate (PQMA), 18.50 g of 9-anthracenemethyl methacrylate (AMMA) and 5.97 g of azobis(isobutyronitrile) (AIBN) initiator were mixed and purged with nitrogen gas for 30 minutes. The deaerated reaction mixture was heated by means of a heating mantle at 70° C. for 5 hours, to promote the polymerization. Thereafter, the reaction mixture was cooled to room temperature under nitrogen atmosphere. When the temperature of the mixture reached down to 30° C., 9 g of methanol was added so as to terminate the reaction. The obtained PGMEA solution was poured into twice volumes of hexane, to precipitate the polymer. The precipitated polymer was collected and washed three times with a mixture of water and methanol, and then dried at 40° C. for 48 hours.

As a result of the above procedure, 56.66 g of the polymer was obtained (yield: 94.9%). The molecular weight of the product was measured, to find that the product had a weight average molecular weight Mw of 21910 Da, a number average molecular weight Mn of 8572 Da and a polydispersity index PDI of 2.56.

Preparation of Composition [R] for Forming a Bottom Anti-Reflective Coating

To the polymer of Example 16 (1.904 parts), N,N'-1,3-phenylenedimaleimide (3.916 parts), propyleneglycol monomethyl ether (PGME, 125.6 parts), cyclohexanone (3.721 parts) and γ-valerolactone (1.479 parts) were added. The mixture was stirred for 30 minutes at room temperature, to prepare a composition [R] for forming a bottom anti-reflective coating.

Evaluation of Composition [R] for Forming a Bottom Anti-Reflective Coating

The composition [R] for forming a bottom anti-reflective coating was cast by spin-coating on a silicon microchip wafer, and crosslinked by heating at 190° C. for 60 seconds on a vacuum hot-plate, to obtain a bottom anti-reflective coating. The obtained coating was measured by means of ellipsometer, and it was found that the refractive index (n value) and the extinction coefficient (k value) at 248 nm were 1.6905 and 0.1959, respectively. The refractive index (n value) and the extinction coefficient (k value) at 193 nm were also found to be 1.7552 and 0.5782, respectively.

Independently, the above procedure was repeated and the composition was baked at 190° C. to form a bottom anti-reflective coating. It was verified that the formed coating was insoluble in either of ethyl lactate and a mixture of propyleneglycol monomethyl ether acetate (30) and propyleneglycol monomethyl ether (70).

Successively, on the obtained bottom anti-reflective coating, a commercially available 193 nm positive-working photoresist was spin-coated. The formed resist layer was soft-baked on a vacuum hot-plate under recommended conditions, and then imagewise exposed to radiation of 193 nm through a photomask. After subjected to post-exposure baking at a recommended temperature, the resist layer was developed with a 2.38 wt % TMAH aqueous solution. As a result of this development, the photoresist layer was removed in the area demarcated by the photomask. In the area exposed to radiation, the photoresist was dissolved away to leave the anti-reflective coating in tact. The formed pattern was able to resolve nicely up to 110 nm feature size by use of a mask with a line-and-space pattern having a pitch of 1:1 and line width 140 nm.

Example 17

Synthesis of PQMA/AMMA/EdMA/MAA (54/29/12/5) Tetrapolymer

In a 250 mL round-bottom flask equipped with a mechanical stirrer, a condenser, a nitrogen inlet and a thermostat, 31 g of methyl amyl ketone (MAK) was placed and purged with nitrogen gas for 30 minutes. The deaerorated solvent was then heated at 80° C. Independently, 3.95 g of 2-ethyladamantyl methacrylate (EAdMA), 12.98 g of 4-hydroxyphenyl methacrylate (PQMA), 10.25 g of 9-anthracenemethyl methacrylate (AMMA), 0.57 g of methacrylic acid (MAA) and 1.11 g of azobis(isobutyronitrile) (AIBN) initiator were dissolved in 70 g of MAK, and then purged with nitrogen gas for 30 minutes. The obtained deaerated mixture was added over a period of 3 hours into the above pre-heated solvent in the flask by means of a syringe pump. The reaction mixture was further kept heated at 80° C. for 3 hours, to promote the polymerization. Thereafter, the reaction mixture was cooled to room temperature under nitrogen atmosphere. When the temperature of the mixture reached down to 30° C., 4 g of methanol was added so as to terminate the reaction. The obtained MAK solution was poured into twice volumes of hexane, to precipitate the polymer. The precipitated polymer was collected and washed three times with a mixture of water and methanol, and then dried at 40° C. for 48 hours.

As a result of the above procedure, 26.90 g of the polymer was obtained (yield: 93.2%). The molecular weight of the product was measured, to find that the product had a weight average molecular weight Mw of 10701 Da, a number average molecular weight Mn of 5515 Da and a polydispersity index PDI of 1.94.

Preparation of Composition [S] for Forming a Bottom Anti-Reflective Coating

To the polymer of Example 17 (1.872 parts), N,N'-1,3-phenylenedimaleimide (0.228 part), propyleneglycol monomethyl ether (PGME, 142.1 parts), cyclohexanone (4.335 parts) and γ-valerolactone (1.479 parts) were added. The mixture was stirred for 30 minutes at room temperature, to prepare a composition [S] for forming a bottom anti-reflective coating.

Evaluation of Composition [S] for Forming a Bottom Anti-Reflective Coating

The composition [S] for forming a bottom anti-reflective coating was cast by spin-coating on a silicon microchip wafer, and crosslinked by heating at 190° C. for 60 seconds on a vacuum hot-plate, to obtain a bottom anti-reflective coating. The obtained coating was measured by means of ellipsometer, and it was found that the refractive index (n value) and the extinction coefficient (k value) at 248 nm were 1.6808 and 0.2124, respectively. The refractive index (n value) and the extinction_coefficient (k value) at 193 nm were also found to be 1.741 and 0.5520, respectively.

Independently, the above procedure was repeated and the composition was baked at 190° C. to form a bottom anti-reflective coating. It was verified that the formed coating was insoluble in either of ethyl lactate and a mixture of propyleneglycol monomethyl ether acetate (30) and propyleneglycol monomethyl ether (70).

Successively, on the obtained bottom anti-reflective coating, a commercially available 193 nm positive-working photoresist was spin-coated. The formed resist layer was softbaked on a vacuum hot-plate under recommended conditions, and then imagewise exposed to radiation of 193 nm through a photomask. After subjected to post-exposure baking at a recommended temperature, the resist layer was developed with a 2.38 wt % TMAH aqueous solution. As a result of this development, the photoresist layer was removed in the area demarcated by the photomask. In the area exposed to radiation, the photoresist was dissolved away to leave the anti-reflective coating in tact. The formed pattern was able to resolve nicely up to 145 nm feature size by use of a mask with a line-and-space pattern having a pitch of 1:1 and line width 140 nm.

The invention claimed is:

1. A composition for forming a bottom anti-reflective coating, comprising
a solvent,
a polymer represented by the following formula (I):

in which
A and B are repeating units represented by the following formulas (A) and (B), respectively

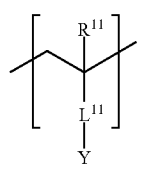

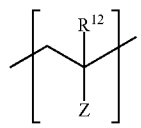

wherein
each of $R^{11}$ and $R^{12}$ is independently hydrogen or an alkyl group;
$L^{11}$ is a single bond, COO or a straight- or branched chain alkylene containing one or more carbon atoms;
Y is a condensed polycyclic aromatic group containing two or more benzene rings wherein one of the benzene rings is optionally replaced with a quinone ring; and
Z is a group selected from the group consisting of $R^3COOR^4$ and $R^3OR^4$, provided that R3 is a single bond, oxygen or a straight- or branched chain alkylene which may have a fluorine atom and which contains one or more carbon atoms and also provided that $R^4$ is hydrogen or a substituted or non-substituted hydrocarbon group; each of m and n is a number indicating the polymerization degree provided that m is not less than 10 and n is not less than 0;
and,
a compound represented by formulas (3)

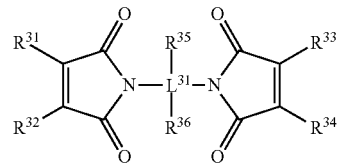

in which each of $R^{31}$ to $R^{36}$ is independently a group selected from the group consisting of hydrogen, alkyl, aryl, halogen, alkoxy, nitro, aldehyde, cyano, amido, dialkylamino, sulfonamido, imido, carboxylic acid, carboxylic acid ester, sulfonic acid, sulfonic acid ester, alkylamino, and arylamino; and $L^{31}$ is an alkylene or an arylene; and further comprising a photo acid generator.

2. The composition according to claim 1, where Y is a condensed polycyclic aromatic group containing two or more benzene rings provided that one of the benzene rings is replaced with a quinone ring and that the condensed polycyclic aromatic group may optionally have a substituent selected from the group consisting of alkyl, aryl, halogen, alkoxy, nitro, aldehyde, cyano, amido, dialkylamino, sulfonamido, imido, carboxy, carboxylic acid ester, sulfo, sulfonic acid ester, alkylamino, and arylamino.

3. The composition according to claim 1, further comprising a crosslinking agent.

4. The composition according to claim 1,
wherein
each of $R^{11}$ and $R^{12}$ is independently hydrogen or methyl,
$L^{11}$ is COO, and
Z is $R^3COOR^4$, provided that $R^3$ is a single bond or a straight chain alkylene group having 1 to 6 carbon atoms and that $R^4$ is hydrogen or a branched chain alkyl group having 1 to 10 carbon atoms.

5. A bottom anti-reflective coating formed on a substrate the composition of claim 1 and then heating for forming a bottom anti-reflective coating.

6. The bottom anti-reflective coating according to claim 5, formed by a heat-induced Diels-Alder reaction between the polymer represented by the formula (I) and the compound represented by formula (3).

7. A pattern formation method comprising the steps of:
spreading the composition according to claim 1 for forming a bottom anti-reflective coating on a semiconductor substrate and then baking, to form a bottom anti-reflective coating;

forming a photoresist layer on the bottom anti-reflective coating;

exposing to light the semiconductor substrate covered with the bottom anti-reflective coating and the photoresist layer; and after the exposure, developing them by use of a developing solution selected from the group consisting of alkaline developing solution and organic solvent, thereby forming a pattern in the photoresist and the antireflective coating.

8. The pattern formation method according to claim 7, wherein the photoresist layer is a positive-working photoresist, $R^4$ is hydrogen, and the developing solution is an alkaline aqueous solution.

9. The pattern formation method according to claim 7, wherein the photoresist layer is made of a positive-working photoresist, $R^4$ is a substituted or non-substituted hydrocarbon group, and the developing solution is an alkaline aqueous solution.

10. The pattern formation method according to claim 7, wherein the photoresist layer is a negative-working photoresist, $R^4$ is hydrogen, and the developing solution is an alkaline aqueous solution.

11. The pattern formation method according to claim 10, wherein the composition for forming a bottom anti-reflective coating further contains a crosslinking agent.

12. The pattern formation method according to claim 7, wherein the photoresist layer is a positive-working photoresist, $R^4$ is a substituted or non-substituted hydrocarbon group, and the developing solution is an organic solvent.

13. The pattern formation method according to claim 7, wherein the exposure is carried out by use of light in the wavelength range of 13.5 to 248 nm.

14. A pattern formation method comprising the steps of:

spreading the composition according to claim 1 for forming a bottom antireflective coating on a semiconductor substrate and then baking, to form a bottom anti-reflective coating;

forming a photoresist layer on the bottom anti-reflective coating;

exposing to light the semiconductor substrate covered with the bottom anti-reflective coating and the photoresist layer; and after the exposure, developing them by use of a developing solution selected from the group consisting of alkaline developing solutions and organic solvents thereby forming a pattern in the photoresist and not in the antireflective coating.

* * * * *